(12) United States Patent
Usui et al.

(10) Patent No.: US 6,596,551 B1
(45) Date of Patent: Jul. 22, 2003

(54) ETCHING END POINT JUDGING METHOD, ETCHING END POINT JUDGING DEVICE, AND INSULATING FILM ETCHING METHOD USING THESE METHODS

(75) Inventors: Tatehito Usui, Chiyoda-machi (JP); Ken Yoshioka, Hikari (JP); Shoji Ikuhara, Hikari (JP); Kouji Nishihata, Tokuyama (JP); Kazue Takahashi, Kudamatsu (JP); Tetsunori Kaji, Tokuyama (JP); Shigeru Nakamoto, Kudamatsu (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/452,174

(22) Filed: Dec. 1, 1999

(30) Foreign Application Priority Data

Dec. 1, 1998 (JP) .......................................... 10-341369
Apr. 14, 1999 (JP) .......................................... 11-107271

(51) Int. Cl.$^7$ ........................ H01L 21/66; H01L 21/302
(52) U.S. Cl. ............................ 438/14; 438/16; 438/706
(58) Field of Search .............................. 438/14, 16, 706

(56) References Cited

U.S. PATENT DOCUMENTS

| 4,198,261 A | * | 4/1980 | Busta et al. ................. 156/626 |
| 4,491,499 A | * | 1/1985 | Jerde et al. .................. 156/626 |
| 4,615,761 A | * | 10/1986 | Tada et al. ................... 156/626 |
| 5,097,430 A | * | 3/1992 | Birang ........................ 364/572 |
| 5,414,504 A | * | 5/1995 | Litvak et al. ................. 356/72 |
| 5,552,016 A | * | 9/1996 | Ghanayem ............... 156/627.1 |
| 5,738,756 A | * | 4/1998 | Liu ......................... 156/627.1 |

FOREIGN PATENT DOCUMENTS

| JP | 60-71922 | 4/1985 |
| JP | 61-53728 | 3/1986 |
| JP | 61-112927 | 5/1986 |
| JP | 63-200533 | 8/1988 |
| JP | 63-254732 | 10/1988 |
| JP | 3-196622 | 8/1991 |
| JP | 4-57092 | 2/1992 |
| JP | 4-032227 | 2/1992 |
| JP | 6-53179 | 2/1994 |
| JP | 8-167589 | 6/1996 |
| JP | 8-232087 | 9/1996 |
| JP | 8-236473 | 9/1996 |
| JP | 9-36095 | 2/1997 |
| JP | 9-213698 | 8/1997 |
| JP | 10-41385 | 2/1998 |
| JP | 10-098022 | 4/1998 |
| JP | 10-313009 | 11/1998 |

\* cited by examiner

*Primary Examiner*—Benjamin L. Utech
*Assistant Examiner*—Lynette T. Umez-Eronini
(74) *Attorney, Agent, or Firm*—Antonelli, Terry, Stout & Kraus, LLP

(57) ABSTRACT

Etching end point judging method that includes the following steps in a dry etching end point judging method having a step of reducing noise of input signal waveforms using first digital filter, a step of obtaining a differential coefficient (primary or secondary) of a signal waveform from differential processing by operation circuit, a step of obtaining a smoothed differential coefficient value by reducing the noise components of the time series differential coefficient waveform that was obtained in the previous step, using the second digital filter, and a step of judging an etching end point by comparing the smoothed differential coefficient value and a preset value using discrimination method.

15 Claims, 19 Drawing Sheets

FIG.9
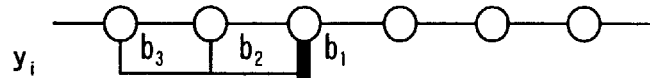
SAMPLING VALUE $y_i$
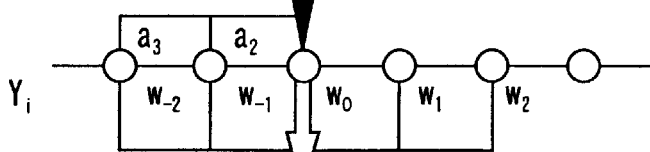
SMOOTHING VALUE $Y_i$
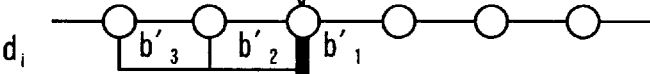
SECONDARY DIFFERENTIAL VALUE $d_i$
SECONDARY DIFFERENTIAL SMOOTHING VALUE $D_i$
FIG.13
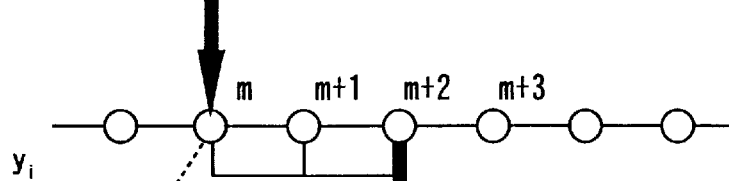
SAMPLING VALUE $y_i$
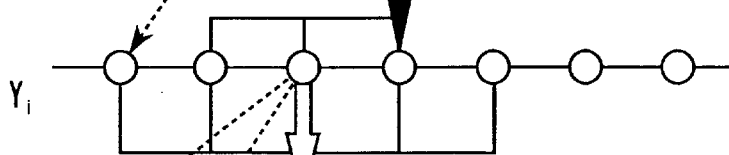
SMOOTHING VALUE $Y_i$
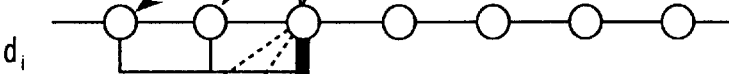
SECONDARY DIFFERENTIAL VALUE $d_i$
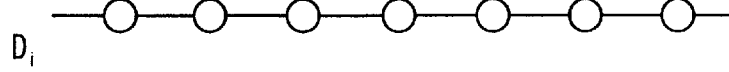
SECONDARY DIFFERENTIAL SMOOTHING VALUE $D_i$ RESIST 201
SiN 202
Low-k (2) 203
SiN 204
BEDDING 205

SiO2 207 — COATING UPPER INSULATION FILM
Low-k (1) 206

PR 209

GROOVE 208

HOLE 210

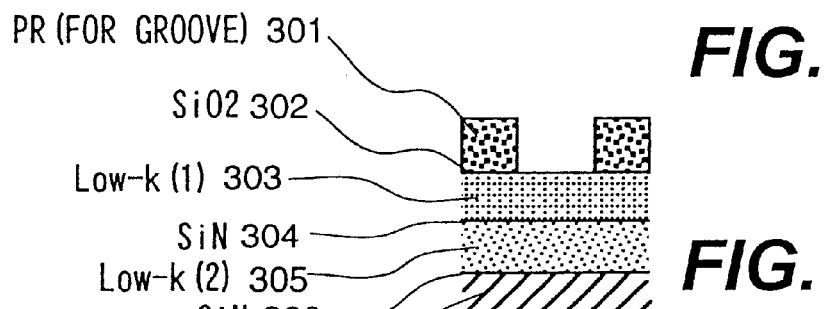
*FIG. 17(a)*
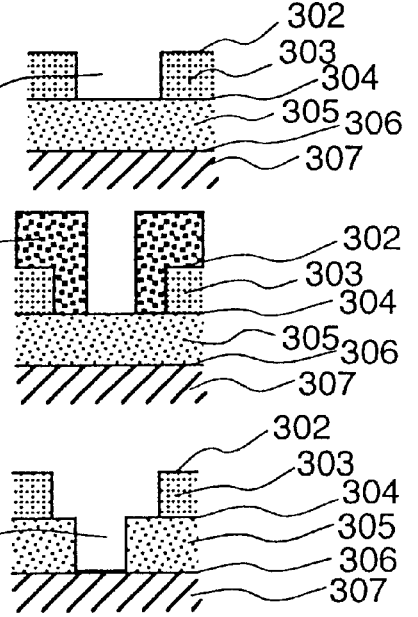
*FIG. 17(b)*
*FIG. 17(c)*
*FIG. 17(d)*
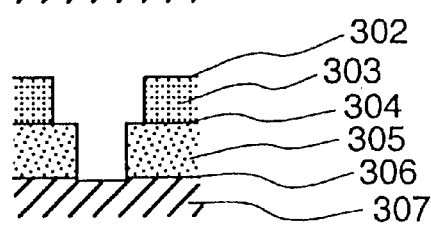
*FIG. 17(e)*

FIG. 18(a)
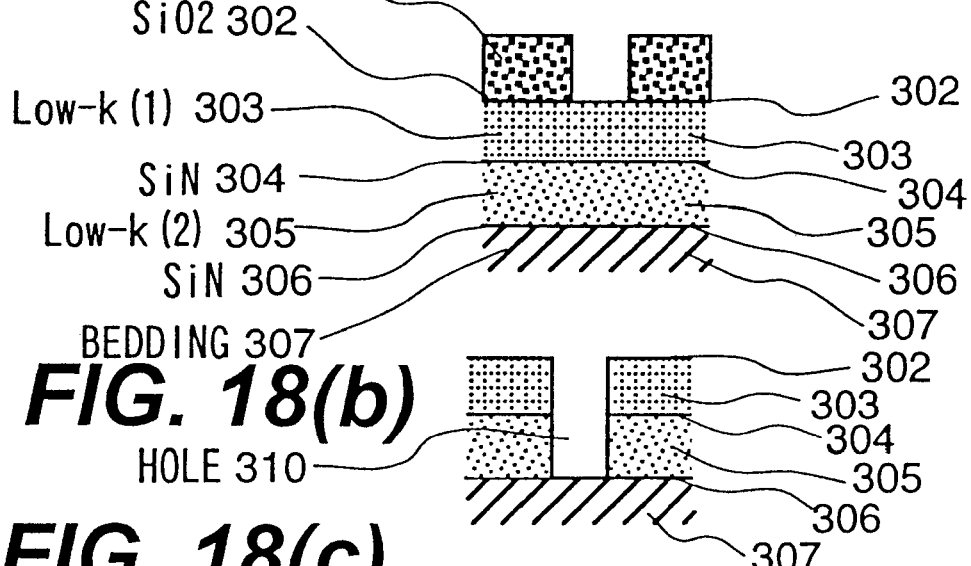
- PR (FOR GROOVE) 301
- SiO2 302
- Low-k (1) 303
- SiN 304
- Low-k (2) 305
- SiN 306
- BEDDING 307
FIG. 18(b)
HOLE 310
FIG. 18(c)
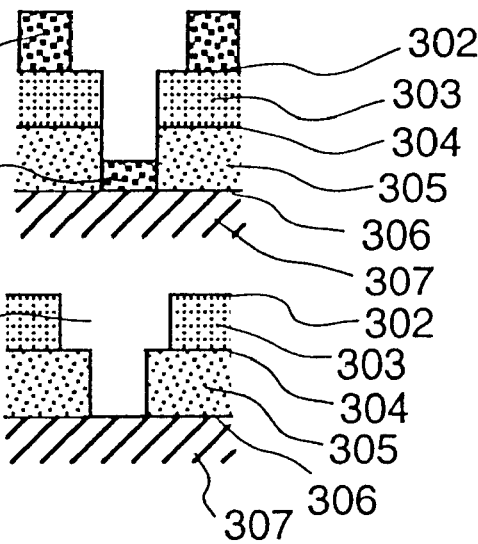
PR FOR GROOVE 311
FIG. 18(d)
GROOVE 308
FIG. 18(e)
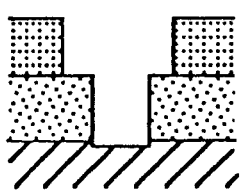
AS ABOVE

FIG. 19(a)
PR (FOR HOLE) 401
SiO2 402
Low-k 403
SiN 404
BEDDING 405
PROCESSING HOLE
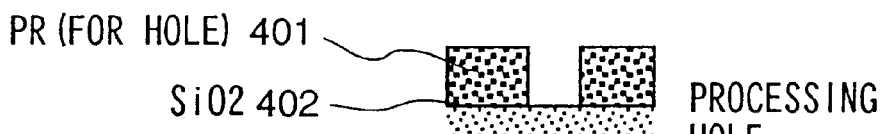
FIG. 19(b)
HOLE 406
— 402
— 403
— 404
— 405
FIG. 19(c)
PR (FOR GRROVE) 407
— 402
— 403.
— 404
— 405
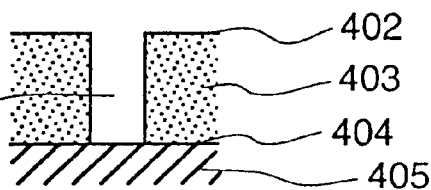
FIG. 19(d)
OPEN THE GROOVE SECTION ON THE OXIDE FILM
AS ABOVE
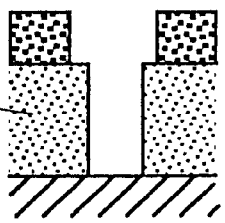
FIG. 19(e)
GROOVE 408
ETCH UP TO THE DEPTH OF THE GROOVE
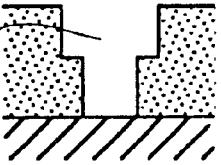
FIG. 19(f)
ETCH THE BEDDING LAYER
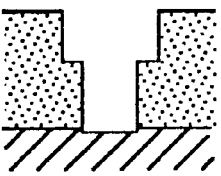

SiO2 501
Low-k (1) 502
BOUNDARY FACE 503
Low-k (2) 504
SiN 505
BEDDING 506

GROOVE 507
LAYER THAT APPEARED AT
THE BOTTOM OF THE GROOVE 503
(BOUNDARY FACE 503)
HOLE 508

- PR 601
- p-TEOS (SiO2) 602
- SOG 603
- SiN 604
- Si 606
- BEDDING 605
- 607

- 601 (PR AFTER ETCHING)
- 607
- 608

ETCHING END POINT JUDGING METHOD, ETCHING END POINT JUDGING DEVICE, AND INSULATING FILM ETCHING METHOD USING THESE METHODS

BACKGROUND OF THE INVENTION

This invention relates to an etching end point judging method and to devices suitable for detecting etching processing end points in a plasma discharge process through use of emission spectrometry; and, the invention also relates to an insulation film etching method using the etching end point judging method and the etching processing detection devices. The insulation films include a silicon oxide film (referred to as an oxide film henceforth) and a low-k film consisting of a material having a low dielectric constant.

During dry etching processing of a semiconductor wafer, the emission intensity at a specific wavelength in plasma light changes according to the etching progress of a specific film. A conventional semiconductor wafer etching end point detection method is available to detect changes in the emission intensity at a specific wavelength from plasma and detect an etching end point of a specific film based on the detection result during dry etching processing. In this method, detection errors caused by an irregularity in the detected waveforms due to noise must be prevented. In this regard, methods for improving the detection accuracy of the emission intensity changes are disclosed in Japanese Non-examined Patent Publication No. 61-53728 and No. 63-200533. In Japanese Non-examined Patent Publication No. 61-53728, noise is reduced by a method of moving averages, and in Japanese Non-examined Patent Publication No. 63-200533, noise is reduced by noise square approximation processing.

In an etching end point judging device that judges an etching end point of a wafer which is being processed by etching with a plasma discharge using emission spectrometry, the detection signal becomes weaker after each wafer processing due to attachment of deposits. As described in Japanese Non-examined Patent Publication No. 63-254732, detection signals can be corrected by changing the gain value and offset value of the detection signal for stable etching end point detection. Alternatively, as described in Japanese Non-examined Patent Publication No. 04-57092, without the addition of a gain and offset adjustment function, the detection signal that was fetched to the optical conversion method can be adjusted to a set value for stable etching end point detection.

With the recent progress toward downsizing and high integration of semiconductors, the opening rate (area to be etched) on a semiconductor wafer is becoming smaller and the emission intensity at a specific wavelength that is fetched by a light detector of an optical sensor is becoming weaker. As a result, the level of the sampling signal from a light detector is becoming lower, making it difficult to detect an etching end point correctly based on a sampling signal from the light detector.

As the size of a semiconductor device becomes smaller, the electrical capacity of the silicon oxide film used for insulation between wires increases, and the signal loss between wires can no longer be ignored. As a solution to this problem, a method of reducing the electrical capacity between wires is being developed in which a low dielectric constant material is used as the insulation material between wires. Various materials have been developed as candidates for low dielectric constant materials (referred to as low-k materials henceforth). As described on page 74 in the monthly magazine Semiconductor World, 1998, No. 11, these materials include FSG (k=3.3 to 3.6), HSQ (k=2.9 to 3.1), and Xerogel (k=2.0 or less) as inorganic low-k films, SiLk (k=2.6), BCB (k=2.6), FLARE (k=2.8), and PAE (k=2.8) as organic low-k films, and organic SOG (k=2.8 to 2.9) and HSG (k=2.9).

In addition, a damascene process that enables wiring using copper that has a lower electric resistance than conventional wiring materials is being developed through use of a flattening process (CMP) based on chemical and mechanical corrosion technology.

In the damascene process, the main method is the dual damascene method in which a wiring groove is formed by plasma etching after forming a low-k film, which is used as an insulating material between wires and layers, and then a contact hole is formed between the two layers for permitting electrical connection to the lower layer. The process of the dual damascene method differs depending on whether a contact hole or a groove is etched initially. Currently, various methods are being examined. In either case, grooves and contact holes must be formed on low-k films using plasma etching. By using a process of high precision plasma etching with fewer stages, the yield can be enhanced and the cost can be reduced, thereby substantially enhancing the characteristics of plasma etching (etching process and performance).

However, in the currently manufactured damascene structure, an etching stopper layer is formed by inserting a silicon nitride film on the boundary between the groove and the hole provided on the low-k film. Consequently, the need for a stopper layer formation process and the increase of the dielectric constant of the film due to insertion of a stopper layer become problems. There will be no problem if the dielectric constant of the stopper layer is low. However, to satisfy requirements regarding an etching selection ratio and adherence with the low-k film, a silicon nitride layer is currently being used.

Even if a stopper layer is inserted, the film thickness cannot be increased in terms of an increase of the dielectric constant. Therefore, accurate judgment is necessary regarding whether etching has progressed to the stopper layer. Although the ordinary end point judging system can detect this, more accurate judgment is required. The better method is to employ a structure that does not require insertion of a stopper layer, however, such etching becomes difficult under current conditions.

In an insulating film etching device, a change with the passage of time is detected, such as deterioration of the etching speed, as the etching is repeated. In some cases, the etching may stop. This problem must be solved. In addition, it is important to monitor fluctuations in the etching speed with time for stable operation; however, in the conventional method, the end point judgment time is simply monitored. Moreover, when the etching duration becomes short, such as about 10 seconds, the judgment preparation time and the judgment interval must also be reduced in the end point judgment method. However, in the conventional method, a sufficient measure to address this requirement has not been taken. For an insulation film, as the etched area is often 1% or less, the changes in the plasma emission intensity from the residue that is generated as a result of etching is small. Consequently, an end point judging system that can detect very small changes is necessary. However, a practical system at a reasonable price is not available at present.

To resolve the problem of drift in a lithography position during etching for forming a contact hole on an insulation film, a self-alignment contact technology has been developed. In the end point judgment used in this technology also, since the etched area of the last contact section is small (1% or less), a system having a high detection sensitivity for plasma emission intensity changes is necessary; however, the end point judging system presently available does not satisfy the requirements for high precision and a reasonable cost.

SUMMARY OF THE INVENTION

The primary object of this invention is to provide an etching end point judging method and a detection device that are capable of stable detection of etching end points of semiconductor wafers even for a semiconductor wafer having a low opening rate.

The secondary object of this invention is to develop a method of obtaining high-quality etching results by detecting plasma etching end points of semiconductor thin films using an end point judging system that can detect very small changes of plasma emissions and also can measure the data in a short time during plasma processing, in particular, plasma etching processing.

Another object of this invention is to provide an etching end point judging method and a detection device that can eliminate any end point judging detection errors when a pulse type noise is induced in an emission intensity sampling signal (for instance, instantaneous termination of discharge power or an abnormality caused by modulation of the emission intensity due to a sudden change of the plasma state caused by an instability).

Another object of this invention is to provide an etching end point judging method and a detection device that can easily display occurrences of plasma discharge abnormalities as history data.

Another object of this invention is to provide an etching method for enabling high-precision etching in a damascene process and a self-alignment process using a method or system that can measure, with a high precision, end points of an insulation film etching process of a semiconductor device.

Another object of this invention is to prevent etching faults in an etching device, which are caused by changes in time, by determining the etching speed through measurement of the etching time required to etch up to the stopper layer in the damascene process or up to the insulation film on the gate in the self-alignment contact process, and monitoring the fluctuations. By judging the correct time required for reaching the stopper layer in the damascene process, corrosion of a thin silicon nitride layer can be retarded, thereby improving the real selection ratio.

Another object of this invention is to control deterioration of device performance by retarding excessive advancement of etching on the bedding layer by judging the correct etching ending time, since etching ends in a short time, in the process for removing the silicon nitride layer that was formed on the bedding in a damascene process or a self-alignment contact process.

An object of this invention is to provide an etching end point judging method for use in dry etching. The method includes a step of reducing noise by processing input signal waveforms through a first digital filter, a step of finding a differential coefficient (primary or secondary) of a signal waveform through differential processing, a step of obtaining a smoothed differential coefficient value by reducing the noise component of the time series differential coefficient that was obtained by the previous step, and a step of judging an etching end point by comparing the smoothed differential coefficient value and a preset value through discrimination.

Another object of this invention is to provide an etching end point judging method for judging an etching end point from time series data of an emission intensity differential coefficient. The method includes a step of displaying a transition of time series data of the differential coefficient through a display method and adding the display indicating an abnormality on the display of the time series data of the differential coefficient when an abnormality is detected.

Another object of this invention is to provide an etching end point judging device that uses emission spectrometry. The device is equipped with an AD converter for obtaining emission intensity time series data of a specific wavelength, a first digital filtering device for performing smoothing processing for the time series data, a differential operation device for obtaining a differential coefficient of the smoothed time series data, a second digital filtering device for performing smoothing processing for the time series data of the differential coefficient that was calculated, and a discrimination device for judging an etching end point by comparing the smoothing differential coefficient value and a preset value.

Another object of this invention is to provide an insulation film etching method for judging an etching end point using the etching end point judging method described above in the etching of an insulation film containing a low-k film consisting of a silicon oxide film or a low dielectric constant material.

This invention can provide a very stable method for judging etching processing end points, since it enables accurate calculation of emission intensity changes. In addition, in end point judgment that includes differential coefficient calculation processing, noise in the sampling signals from a light detector can be reduced effectively by setting digital filtering processing before and after differential coefficient calculation processing, enabling stable and accurate end point judgment.

By setting coefficient correction processing in digital filtering processing in the former stage, differential coefficient calculation processing, and digital filtering processing of the latter stage, noise of sampling signals from a light detector can be reduced effectively in the case of an abnormality occurring during the etching processing, enabling stable and accurate end point judgment.

By drawing in a zero or the preset display position with a specific color arrangement when an etching processing abnormality occurs during differential coefficient display, a high-quality device that facilitates abnormality monitoring during etching processing can be provided.

This invention enables execution of a correct end point judgment, thereby providing the effect of setting a lower over-etching than obtainable with time management etching. As a result, excessive corrosion of the bedding layer can be controlled. Since this invention reduces the over-etching duration, improvement of the throughput can be expected. Since changes in the passage of the etching time can be monitored, an etching device abnormality can be detected at an early stage, enabling prevention of a large number of etching faults.

This invention enables determination of a correct sense voltage value for the target output value of a photo-multiplier by using a sense voltage value for a target output voltage value of a photo-multiplier through a relational expression. Therefore, even for a semiconductor wafer having a small opening rate, the etching signals used for stable detection of etching end points of semiconductor wafers can be controlled to a specified value repeatedly without any irregularity between wafers.

By using the end point judging system of this invention, judgment can be prepared in a short time and small plasma emission intensity changes can be detected. Therefore, this system can be applied to end point judgment of insulation film etching of a small etched area.

BRIEF DESCRIPTION OF THE DRAWINGS

FIG. 9 is a diagram which shows the calculation flow of smoothed differential coefficient time series data Di according to this invention.

FIG. 13 is a graph which shows the processing procedure in the second implementation example of the calculation flow of smoothed differential coefficient time series data Di according to this invention.

FIGS. 17(a) to 17(e) show an example of a damascene process that processes a groove first.

FIGS. 18(a) to 18(e) show an example of a damascene process that processes a hole first.

FIGS. 19(a) to 19(f) show an example of a process when a boundary layer between a hole and a groove is not formed.

DETAILED DESCRIPTION OF THE PREFERRED EMBODIMENTS

Figure 1:
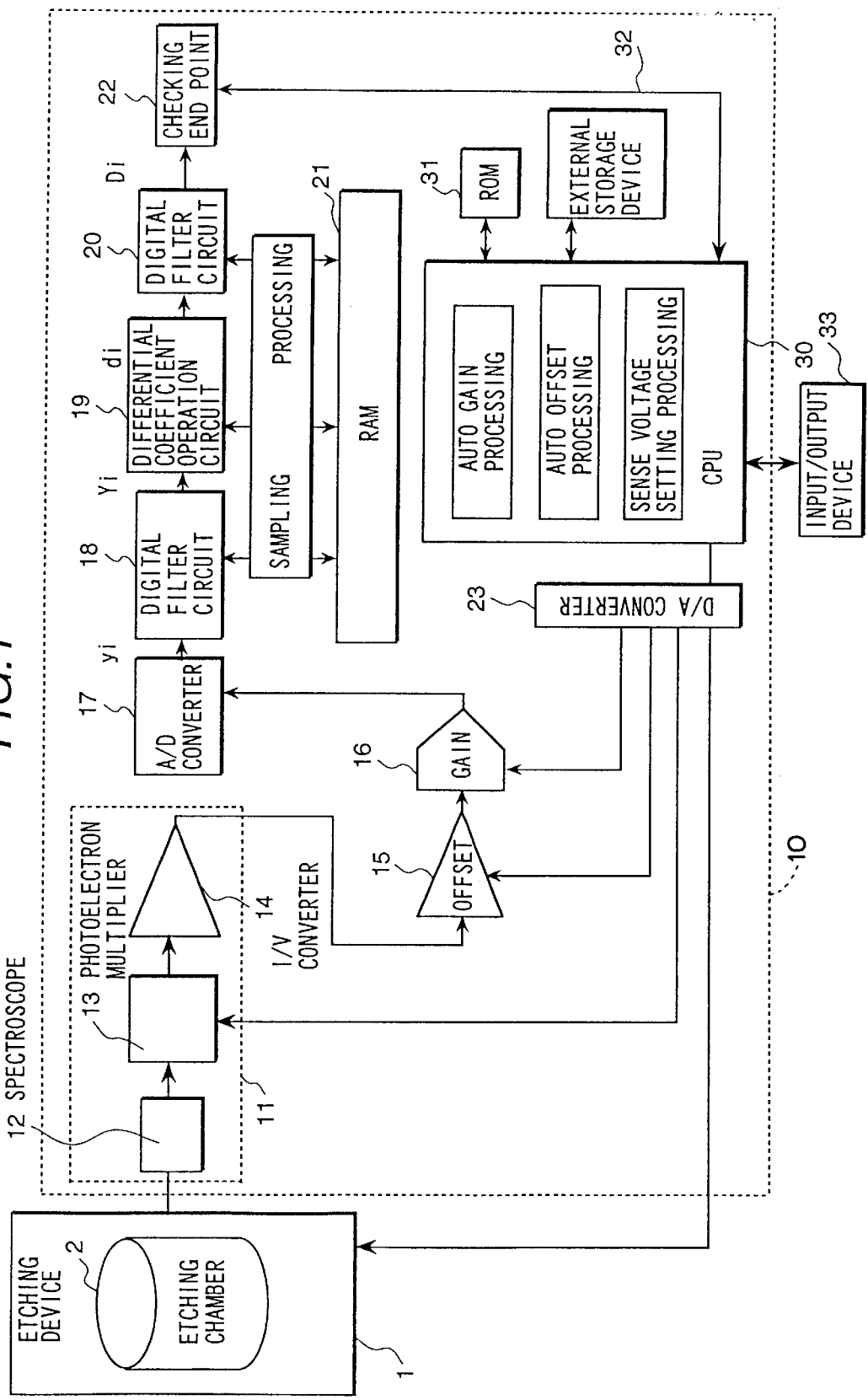
FIG. 1 is a block diagram of an etching end point judging device that represents an example of this invention.

The following section describes a first example of this invention. FIG. 1 will be used to explain etching of a semiconductor wafer. In FIG. 1, the configuration of a semiconductor wafer etching device 1 and etching end point detector 10 is outlined.

In the etching device 1, the etching gas introduced into etching chamber 2 is transformed to a plasma after being decomposed by microwave power, and a semiconductor wafer is etched by the plasma. Etching end point detector 10 detects plasma light that is generated in the etching chamber 2 during semiconductor wafer etching processing and performs end point judging processing based on the detection result. Etching end point judging detector 10 is equipped with optical detector 11, offset circuit (addition circuit) 15, gain circuit (multiplication circuit) 16, AD converter 17, digital filter circuit 18, differential coefficient operation circuit 19, digital filter circuit 20, RAM 21, judgment circuit 22, DA converter 23, and CPU 30. The programs corresponding to auto offset/auto gain control processing, sense voltage setting processing, sampling processing that includes smoothing processing, and end point judging processing are stored in ROM 31. These programs are executed by CPU 30. Reference numeral 32 denotes an external storage unit and reference numeral 33 denotes an input/output device.

Optical detector 11 detects the emission of a specific wavelength from the plasma that was generated in etching chamber 2 during etching processing using a spectroscope 12 and supplies the emission to a photo-multiplier 13 via an optical fiber. The emission intensity of the specific wavelength that was fetched is transformed to a current detection signal by photo-multiplier 13 according to the emission intensity and is converted to a voltage signal by IV converter 14. The voltage signal converted by IV converter 14 is processed by differential circuit (offset) 15 and amplification circuit (gain) 16.

The signal output by AD converter 17 as a sampling signal is stored in RAM 21 as time series data yi. Digital filter circuit 18 performs smoothing processing for time series data yi and stores the data in RAM 21 as smoothed time series data Yi. Differential coefficient operation circuit 19 calculates time series data di of the differential coefficient value (primary differential value or secondary differential value) from the smoothed time series data Yi and stores the data in RAM 21. Digital filter circuit 20 performs smoothing processing for differential coefficient value time series data di and stores the data in RAM 21 as smoothed differential coefficient time series data Di. Judgment circuit 22 compares the smoothed differential coefficient value with a preset value and detects an etching end point using the raw waveform signal or operation waveform signal.

The detection signal of the raw waveform signal or operation waveform signal is weakened by each wafer processing performed in etching chamber 1 due to deposits attached thereon, changing the end point detection condition for each wafer. By changing the sense voltage for controlling the output voltage of photo-multiplier 13 and the gain of amplification circuit 16, the detection signals of all wafers can be made identical, enabling etching end point detection under the same condition.

As shown in FIG. 1, etching end point judging detection device 10 of this invention is equipped with the functions of auto offset/auto gain control processing, sense voltage setting processing, sampling processing including smoothing processing, and end point judging processing. These functions will be explained with reference to FIG. 2.

When etching processing starts, a sampling start instruction is issued (100). The emission intensity of the specific wavelength that changes according to the etching progress is detected by a light detector as a light detection signal of the voltage corresponding to the emission intensity. The light detection signal is converted to a digital value by an AD converter as sampling signal $I_i$ and is stored in RAM. Time series data $y_i$ (101) of the following expression (1) is determined by auto offset/auto gain control at A/D conversion.

$$y_i = I_i + d_i \qquad (1)$$

$I_i$ is a low gain at offset zero and $d_i$ is a high gain at offset zero.

The next step is to check whether the time is within the sense voltage setting time of light detector 11 (102). If the time is within the voltage setting time, the system advances to sense voltage setting processing (103). When the time exceeds the sense voltage setting time, the system checks to see if time series data yi is the present value, for instance 4 V or higher (106). When time series data yi is 4 V or higher, the system changes the sense voltage to the value for which time series data yi was preset, such as 0.6 V or less (107).

That is, the system reduces noise through the digital filter of the first stage and obtains smoothed time series data (108). Then, the system obtains differential coefficient (primary or secondary) di of the signal waveform through differential processing (109). The system obtains smoothed differential coefficient time series data Di that was generated by reducing the noise component of the time series differential coefficient described above using the digital filter of the second stage (108). The system calculates $(D_i-L)*(D_{i-1}-L)$ using the end point judging level L that was preset (111).

By judging the sign (negative or positive) of $(D_i-L)*(D_{i-1}-L)$, the system performs end point judging processing of the etching process. If the sign is negative, the system judges the result as true and terminates the sampling (113). If the sign is positive, control is returned to the first step 101.

Sense voltage setting processing (103) calculates a sense voltage that makes smoothed time series data yi to be preset voltage ys, using smoothed time series data yi and the dark current value of the detector (104). The processing also checks to see whether smoothed time series data yi is preset voltage ys as shown in the following expression (2) in the sense voltage that was set. If not, the sense voltage is changed (105) and control is returned to the first step 101.

$$yi-ys0 \leq ys \leq yi+ys0 \ ys0=0.1 \ V \qquad (2)$$

This invention enables optimization of optical signal intensity by using the auto sense feature, that is, the characteristics of the photo-electric element. As a result, the light signal intensity can be set to the optimum level at a high speed. This auto sense feature provides a substantial effect for step etching.

The detection precision of sampling signal $I_i$ is restricted by the gain of amplification circuit 16 and the resolution of the AD converter 17. For instance, when an amplification circuit of gain 1 and an AD converter of restricted voltage ±10 V and a resolution of 12 bits are used, the minimum resolution voltage is 4.88 mV and the fluctuation detection precision of the light detection signal of about 2.5 V is 0.2% (0.0488 mV/2.5 V), which is not an acceptable detection precision level. To solve this problem, the detection precision is enhanced by controlling the offset value of the differential circuit 4 and the gain value of amplification circuit 5 that were described above.

Figure 3:
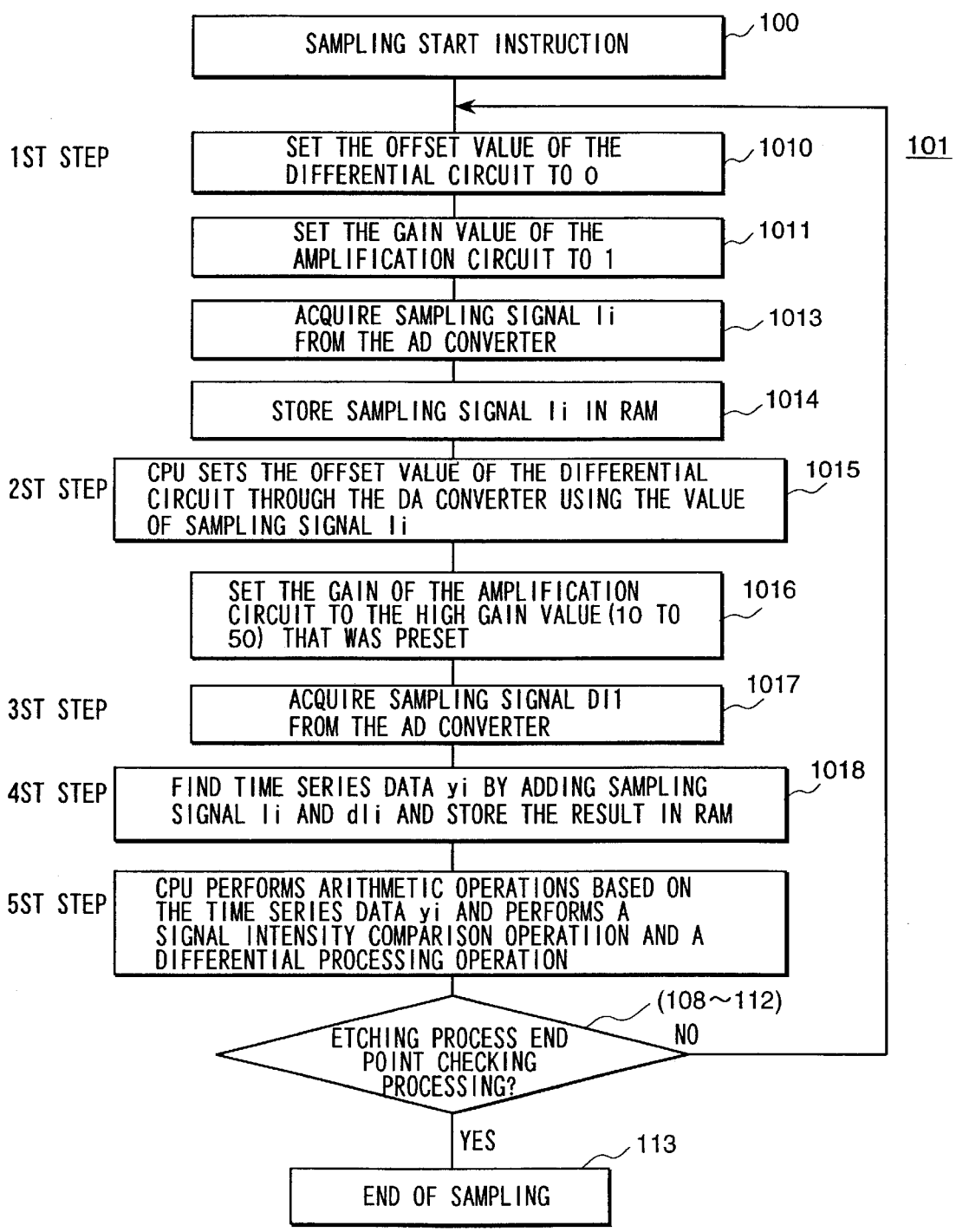
FIG. 3 is a flowchart of the offset control and gain correction in the processing procedure shown in FIG. 2.

FIG. 3 is a flowchart of offset value control of the differential circuit 15 and gain value control of the amplification circuit 16. When a sampling start instruction 100 is issued, the system sets the offset value of the differential circuit 15 to zero (1010) and the gain value of the amplification circuit 16 to 1 (1011). The system fetches the sampling signal $I_i$ that was converted to digital data from a light detection signal by AD converter 17 (1013). The system stores sampling signal $I_i$ in RAM 21 (1014).

Then, CPU 30 sets the offset value of the differential circuit 15 from DA converter 23 using sampling signal value $I_i$ described above. CPU 30 then sets the gain value of the amplification circuit 16 to the preset value (1016). In the next step, the light detection signal of the light detector 11 is converted to digital data by the AD converter through amplification circuit 16, and sampling signal $\Delta I_i$ is obtained (1017). In the next step, CPU 30 stores the value produced by adding sampling signals Ii and $\Delta I_i$ that have been stored, in RAM 21 as time series data yi (1018). CPU 30 performs arithmetic operations based on time series data yi that is stored and performs a signal intensity comparison operation and a differential processing operation.

Auto offset control according to this invention has the following features.

1) Obtains an absolute value of an input signal from the sum of an offset value and a differential amplification value.
2) Obtains an offset value for an absolute value of an input signal and detects a differential amplification value from the offset value.
3) Detects an offset value by setting the gain of the AD conversion to a low gain.
4) Truncates one bit of the offset value to the differential circuit according to the resolution of the DA converter and sets the value.

Auto offset control according to this invention has features in its method of maximizing the resolution of the AD converter by using a differential amplification circuit of an AD converter.

In the first step, an approximate absolute value of the signal voltage is obtained by processing an input signal waveform through AD conversion at low gain operation. The next step is to obtain an input voltage to a differential amplification circuit of the AD converter, considering the resolution of the DA converter (truncating 10 mV and less). Input voltage $V_0$ to the AD converter that was obtained in the previous step is output to a DA converter.

The differential waveform of the input signal is processed by AD conversion at high gain operation, and a high-precision differential signal voltage V, is obtained. The next step is to compose the voltage values that were obtained in the previous 2 steps.

Voltage: $V = V_0 + V_1$

Auto offset control according to this invention enables high-precision AD conversion for changes of signal waveforms with the passage of time. This means that signals of high input waveform intensity can be handled by measuring signal waveforms in a maximum conversion area measuring mode.

Bit quantified errors in the AD conversion can be reduced. Bit quantified errors in DA conversion can also be reduced. As a result of differential amplification, the signal level that is output is reduced and the gain of the AD converter can be maximized, enabling high-precision measurement. High-precision measurement is also enabled for values of input signal waveforms.

Offset control according to this invention can be applied to AD conversion processing of electric signals, such as bias signals, pressure signals, and flow signals, in addition to optical signals, such as EPD. Auto offset control can also extend the dynamic range of an AD converter.

Figure 4:
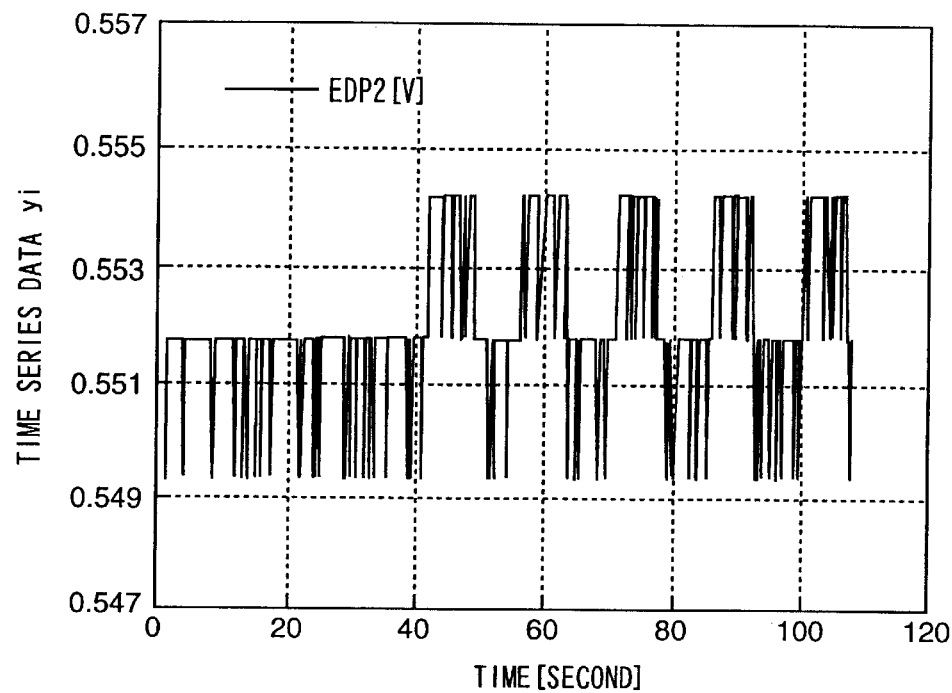
FIG. 4 is a graph which shows an example of an emission fluctuation measurement result when offset control and gain control are not performed.
Figure 5:
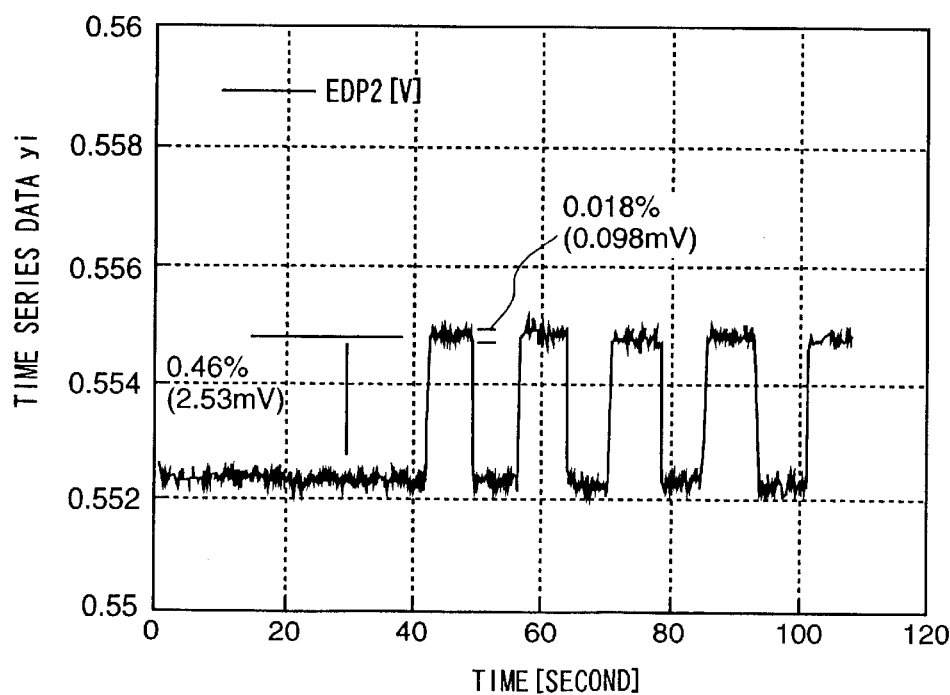
FIG. 5 is a graph which shows an example of an emission fluctuation measurement result when offset control and gain control according to this invention are performed.

FIG. 4 shows an example of emission fluctuation measurement results of the conventional method that does not perform offset control and gain control. FIG. 5 shows an example of emission fluctuation measurement results when offset control and gain control according to this invention are performed. The diagrams indicate an improvement in the emission fluctuation detection precision from about 0.5% to about 0.02% by application of this invention. Consequently, the differential coefficient time series data that is used for judging an end point can be obtained with a high precision, enabling stable end point judgment of the etching processing. Time series data obtained by this invention is zero when there is no plasma emission; and, when etching processing is performed, time series data yi has a value greater than zero. Therefore, to perform arithmetic operations based on the time series data yi that was obtained, no special zero division avoidance processing is required, thereby simplifying the end point judging processing flow and reducing software processing errors.

Sense voltage setting processing will be explained below.

Figure 6:
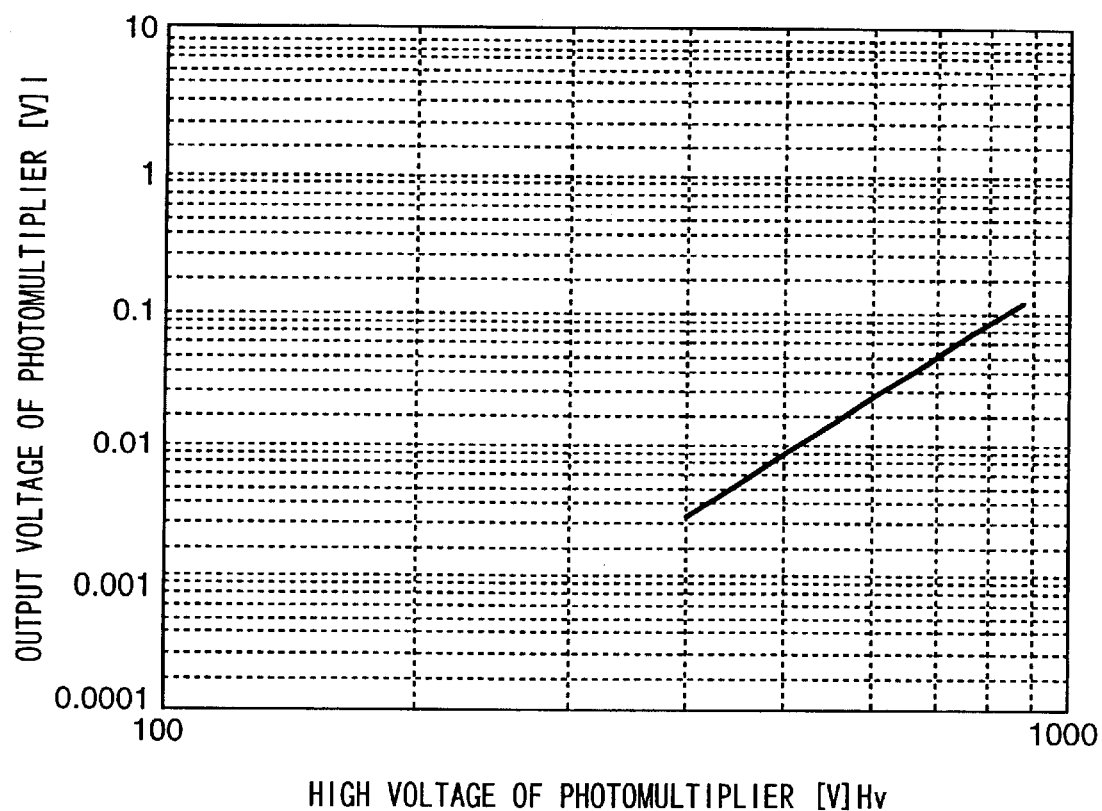
FIG. 6 is a graph which shows multiplication rate characteristics of a photo-multiplier.

By changing the sense voltage of the photo-multiplier 13 through DA converter 23 in FIG. 1, the output voltage of the photo-multiplier 13 can be controlled. FIG. 6 shows the multiplication rate characteristics of photo-multiplier 13. An exponential relationship is established for output voltage I of high-voltage multiplier 13 to high voltage Hv of photo-multiplier 13 and the relation is characterized in the following expression 3.

$$I = Hv^a \quad \text{(For instance } a=7.5\text{)} \tag{3}$$

When the high voltage Hv of photo-multiplier 13 cannot be directly obtained, the voltage can be obtained by converting sense voltage V, that is controlled by the CPU, using the following expression (4).

$$Hv = 50 \times V + 400 \tag{4}$$

Therefore, by using the relationship of expression 4 in expression 3, the sense voltage V can be calculated for obtaining an expected output of photo-multiplier 13 for a certain emission amount. This relationship can be expressed by expression 4 and expression 5.

$$V_1 = Hv_0/50 \cdot \text{Exp}(1/a \times \text{Log}(I_1/(I_0 - I_d))) - 8(Hv_0 = 50 \times V_0 + 400) \tag{5}$$

$I_1$ is the target output voltage of photo-multiplier 13 and $V_1$ is the sense voltage at that time, $I_0$ is the initial output voltage of the photo-multiplier, Id is the output voltage of the dark current of the photo-multiplier, and $V_0$ is the sense voltage at that time.

A photo-multiplier contains a dark current, and, when the sense voltage is low, the dark current imposes a substantial influence on the output voltage of the photo-multiplier. For instance, $I_0$ is the initial output voltage of the photo-multiplier, and, when the sense voltage at the time is very low, a correct sense voltage can be obtained by subtracting the dark current from output voltage $I_0$ of the photo-multiplier as shown in expression 5.

Dark current is measured after a wafer is delivered to a chamber and before a plasma is generated. Alternatively, the dark current may be measured when a wafer is not delivered to a chamber.

By setting sense voltage $V_1$ that was obtained by the method indicated above, a required output voltage of photo-multiplier 13 can be output. The gain of amplification circuit 16 is normally a multiplication of a fixed value.

There is a limit in a sense voltage; and, when a required output voltage I1 of the photo-multiplier is not output even if a maximum sense voltage value is set, normally the operation waveform signal is amplified by adjusting the gain to a fixed multiplication. For instance, if the required output voltage of the photo-multiplier is 2 V and the output voltage is 1 V when a maximum sense voltage value is set, the operation waveform signals used for detecting an etching end point can be matched by setting a gain of normal fixed value 2 for the gain of amplification circuit 16 (gain correction).

Figure 7:
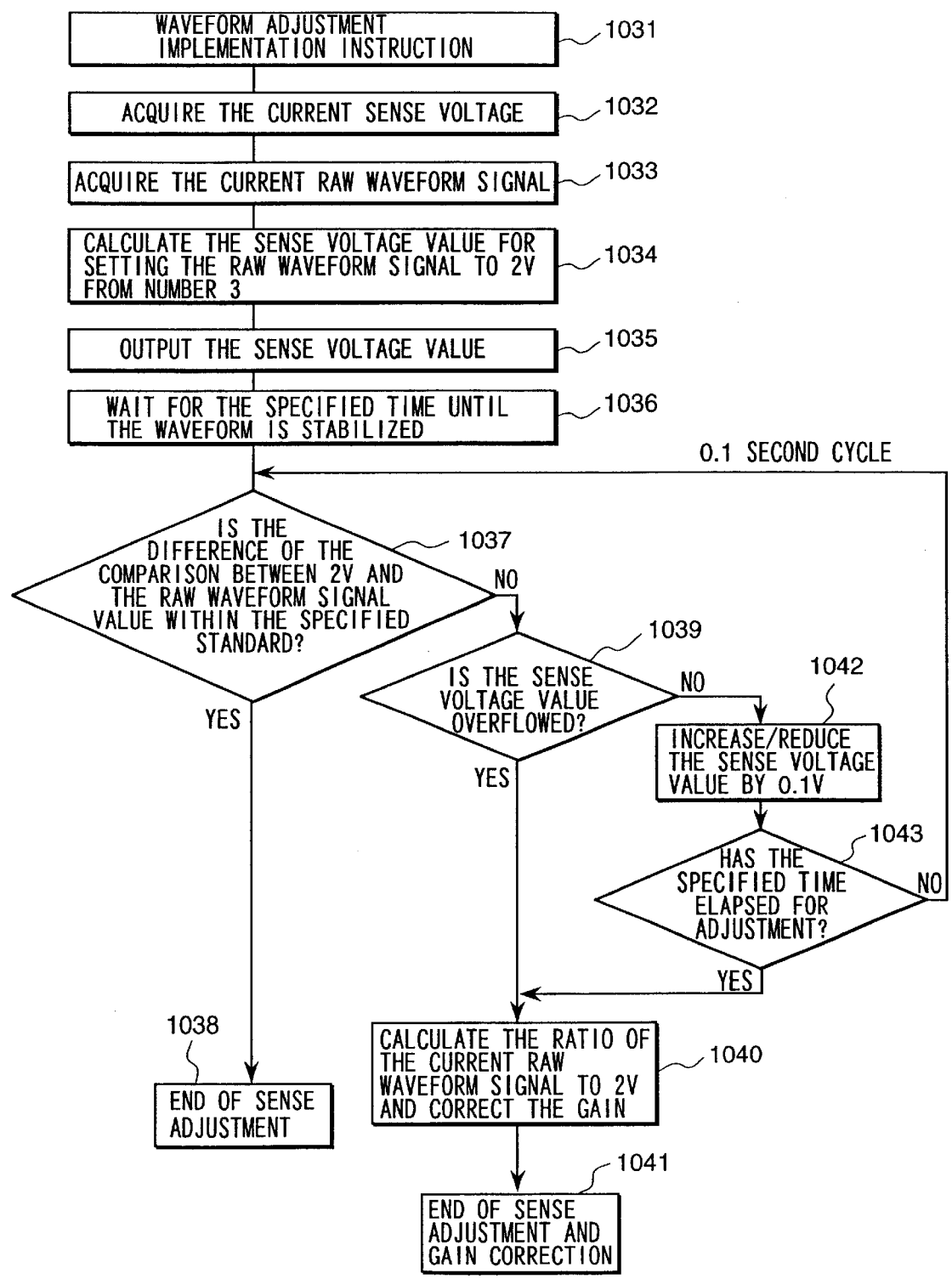
FIG. 7 is a flowchart of sense voltage and gain correction processing.

FIG. 7 is a flowchart which shows an example of a process for obtaining a sense voltage value and a gain value. A waveform adjustment implementation instruction (1031) is issued to perform sense adjustment and gain correction. The current sense voltage value (1032) and the current raw waveform signal value (1033) are obtained by the waveform adjustment implementation instruction (1031). For instance, the sense voltage value is obtained using number 3 and the sense voltage value and raw waveform signal value that were obtained as indicated above is 3, so that the raw waveform signal becomes a target voltage value of 2 V (1034). The sense voltage value that was obtained by photo-multiplier 13 from the DA converter is output (1035) and the system waits for the time required for the adjustment effects to appear (1036). Then, the system compares the target voltage value of 2 V and the current raw waveform signal value and checks to see whether the error is within the standard value (1037). If the error is within the standard value, the system terminates the sense adjustment (1038).

When the error is outside of the standard value, the system takes the following steps. The system checks to see whether the sense voltage value that was output as indicated above exceeds the maximum value (1039). When the value exceeds the maximum value, the system compares the current raw waveform signal value and 2 V, multiplies the ratio by the gain value that is normally set (gain correction) (1040) and terminates the sense adjustment and gain correction (1041). If the sense voltage value that was output as indicated above is not the maximum value, the system increases or reduces the sense voltage value by 0.1 V and outputs the sense voltage value (1042). The system checks to see whether the time spent for sense adjustment is equal to or greater than the specified standard time. If the time is equal to or greater than the specified standard time (1043), the system terminates the sense adjustment (1038), and if the time is less than the specified standard time, the system returns control to the comparison between the target voltage value of 2 V and the current raw waveform signal value (1037), generating a loop. This loop operates, for instance, on a cycle of 0.1 second.

Figure 8:
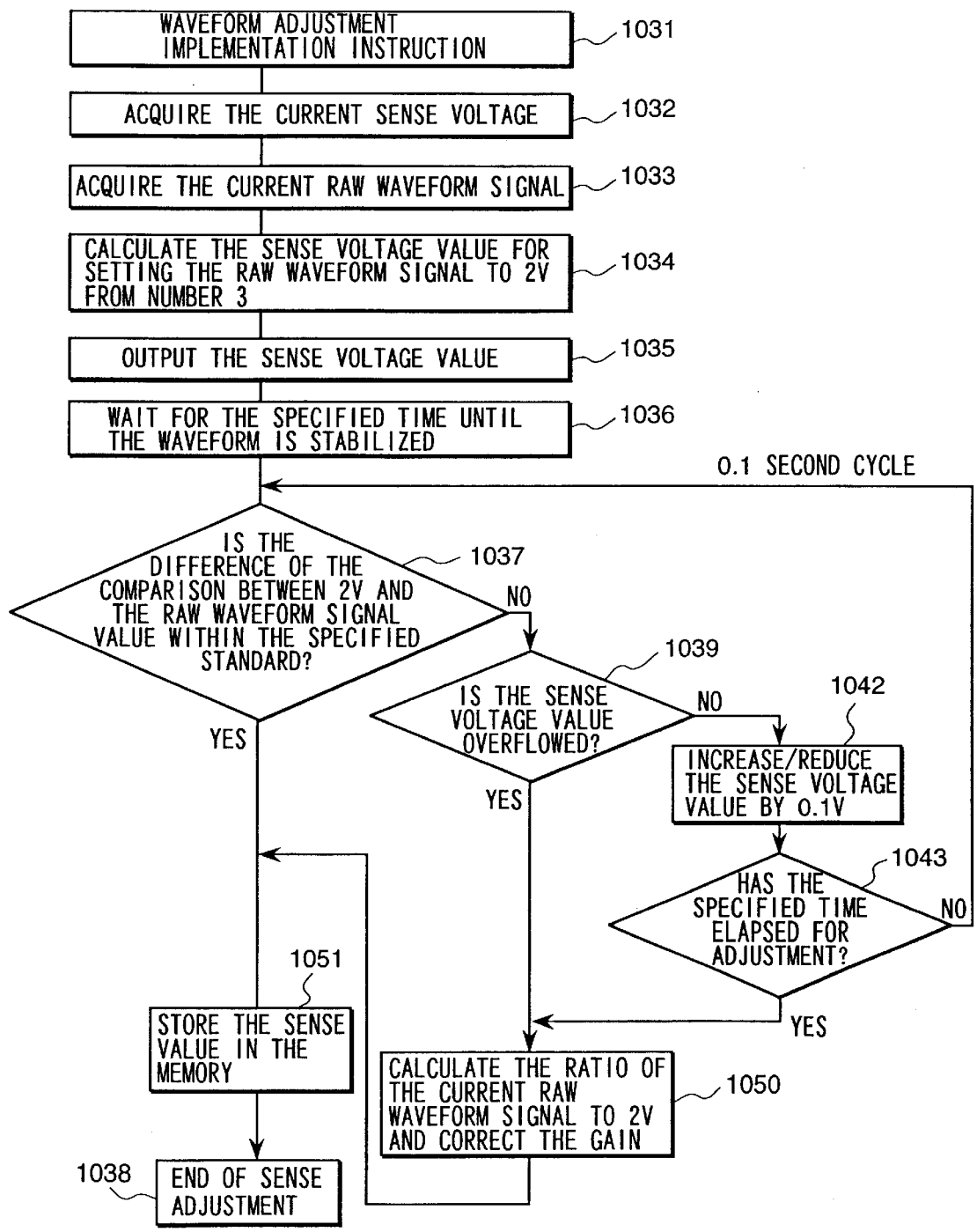
FIG. 8 is another flowchart of sense voltage and gain correction processing.

FIG. 8 is a flowchart of another example of a process for a sense voltage and gain correction. The basic processing flow is the same as the processing flow shown in FIG. 7. When a sense value overflows (1039) or the time spent for sense adjustment exceeds a specified time (1043), the system obtains a ratio of the target raw waveform output voltage, for instance 2 V, to the current raw waveform signal value and stores the result in memory.

The sense voltage value at that time is also stored in memory. The sense voltage output that was obtained is output to the sense value and a fixed value is maintained as the gain. Although the value does not become the target value, which is 2 V, the sense adjustment is terminated by performing a computation based on the ratio between 2 V and the current raw waveform signal value within the program of the microcomputer (1038).

In the etching end point judging device used in this implementation example, since a correct sense voltage value can be obtained for the target output voltage of photomultiplier 13, normally, the gain is a constant value, retarding the irregularity of the S/N ratio of each wafer by the gain and amplification irregularity. When a sense value overflows, a target operation waveform can be obtained by correcting the value with the gain value or correcting the ratio between the target output voltage and the current output voltage within the program to perform stable etching end point judgment.

The process flow for calculation of smoothed differential coefficient time series data Di will be explained in conjunction with FIG. 9. For digital filter circuit 18, a secondary (second-order) Butterworth type low pass filter is used. Smoothed time series data Yi is obtained from a secondary (second-order) Butterworth type low pass filter using the following expression (6).

$$Y_i = b_1 y_i + b_2 y_{i-1} + b_3 y_{i-2} - [a2Y_i - 1 + a3Y_i - 2] \quad (6)$$

Coefficient values "b" and "a" vary according to the sampling frequency and the cutoff frequency. For instance, the following values are applied when the sampling frequency is 10 Hz and the cutoff frequency is 1 Hz.

$$a2=-1.143, a3=0.4128, b1=0.067455, b2=0.13491, b3=0.067455$$

Secondary differential coefficient time series data $d_i$ is calculated using the following expression (7), which uses a polynomial adaptation smoothing differential method of five values of time series data $Y_i$.

$$di = \sum_{j=-2}^{j=2} wjYi+j \quad (7)$$

where,
$w_{-2}=2, w_{-1}=-1, w_0=-2, w_1=-1, w_2=2$.
Calculation of the coefficients is described in the reference material: "Analytical Chemistry" 36 (1964) p.1627 by A. Savitzky, M. J. E. Golay.

$$D_i = b_1 d_i + b_2 d_{i-1} + b_3 d_{i-2} - [a\ 2D_i - 1 + a\ 3D_i - 2] \quad (8)$$

Figure 10:
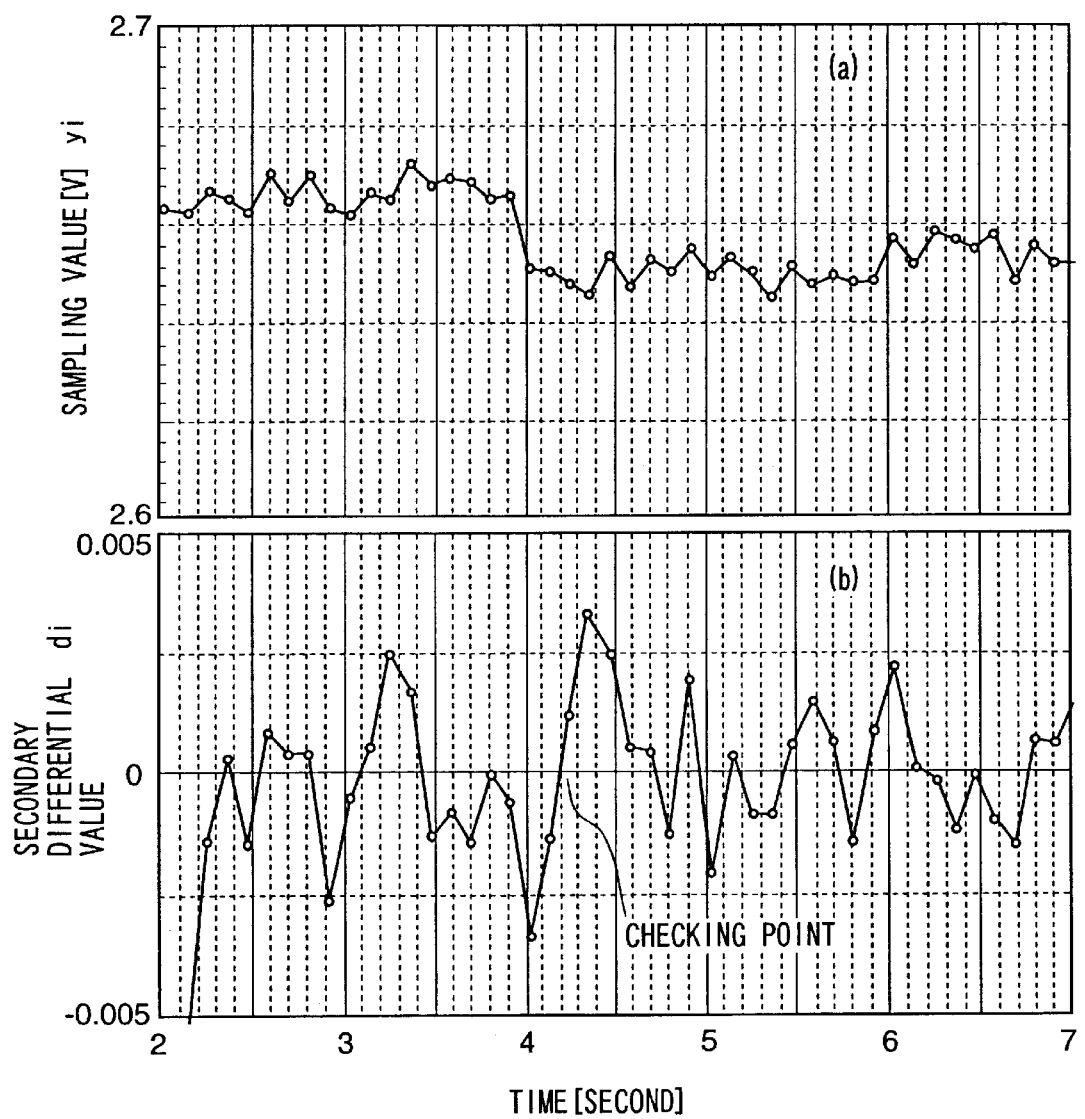
FIG. 10 is a graph which shows the original waveform and processed waveform when the digital filter method of the device shown in FIG. 1 is not used.

As an example for comparison, FIG. 10 shows the original waveform during etching and secondary differential coefficient time series data di that was obtained without using digital filter circuit 18 and digital filter circuit 20. The sampling time series data indicates that the etching end point is reached after 4.2 seconds from the start of the processing. Secondary diffusing time series data di of the differential coefficient value described above, smoothed differential coefficient data Di can be obtained from the following expression (8) through digital filter circuit 7 (secondary (second-order) Butterworth type low pass filter; however, the coefficients may be different from coefficients 'a' and 'b' of digital filter circuit 5). Differential coefficient time series data di does not provide correct information for the judgment due to the noise.

Figure 11:
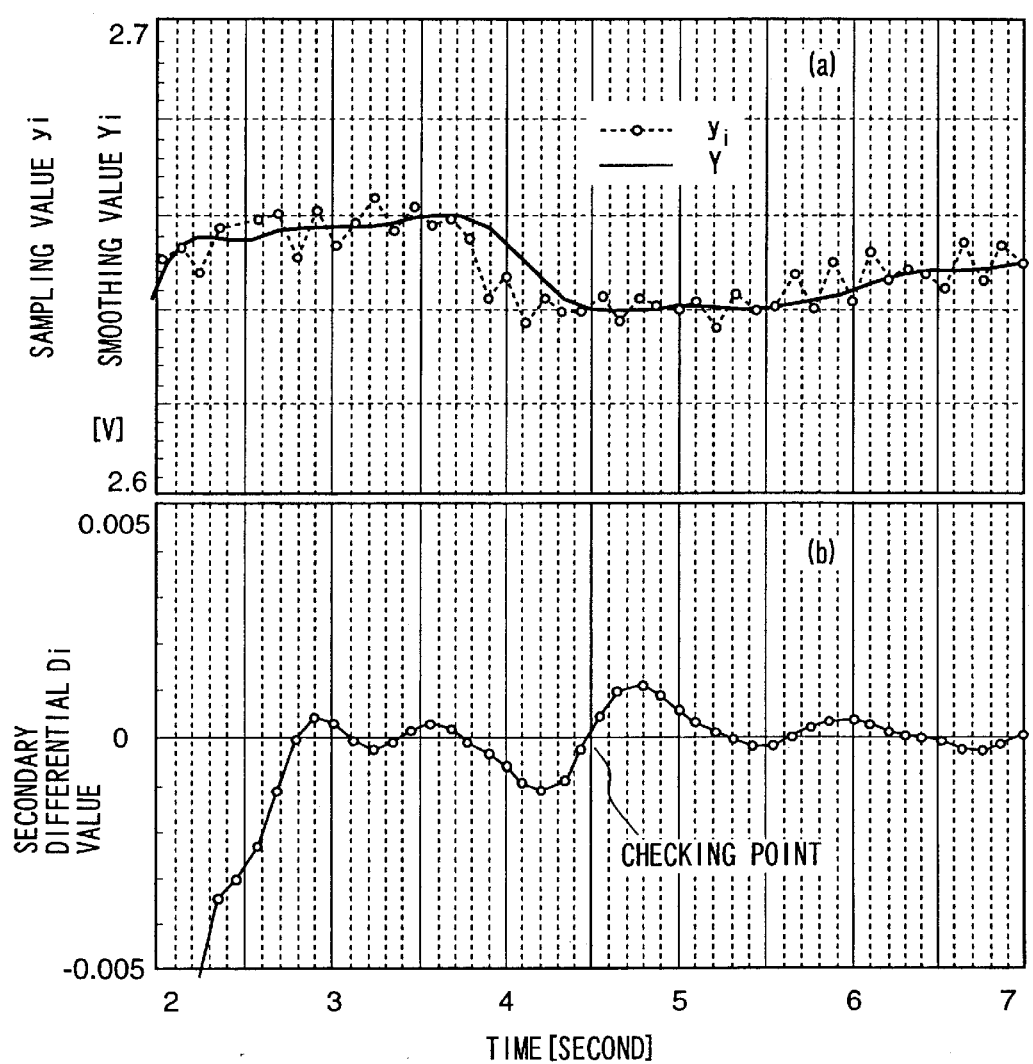
FIG. 11 is a graph which shows the original waveform and processed waveform of the device shown in FIG. 1.

FIG. 11 shows the change of waveform when digital filter circuit 18 and digital filter circuit 20 are used. As shown in the graph, noise in the smoothed secondary differential coefficient time series data Di is reduced, enabling detection of a clear etching processing end point and stable end point judgment. In this way, noise of differential coefficient time series data can be reduced effectively by installing digital filter circuit 18 and digital filter circuit 20 in differential coefficient operation circuit 19. Consequently, accurate differential coefficient time series data used for judging an end point can be obtained for achieving stable end point judgment of etching processing.

Figure 12:
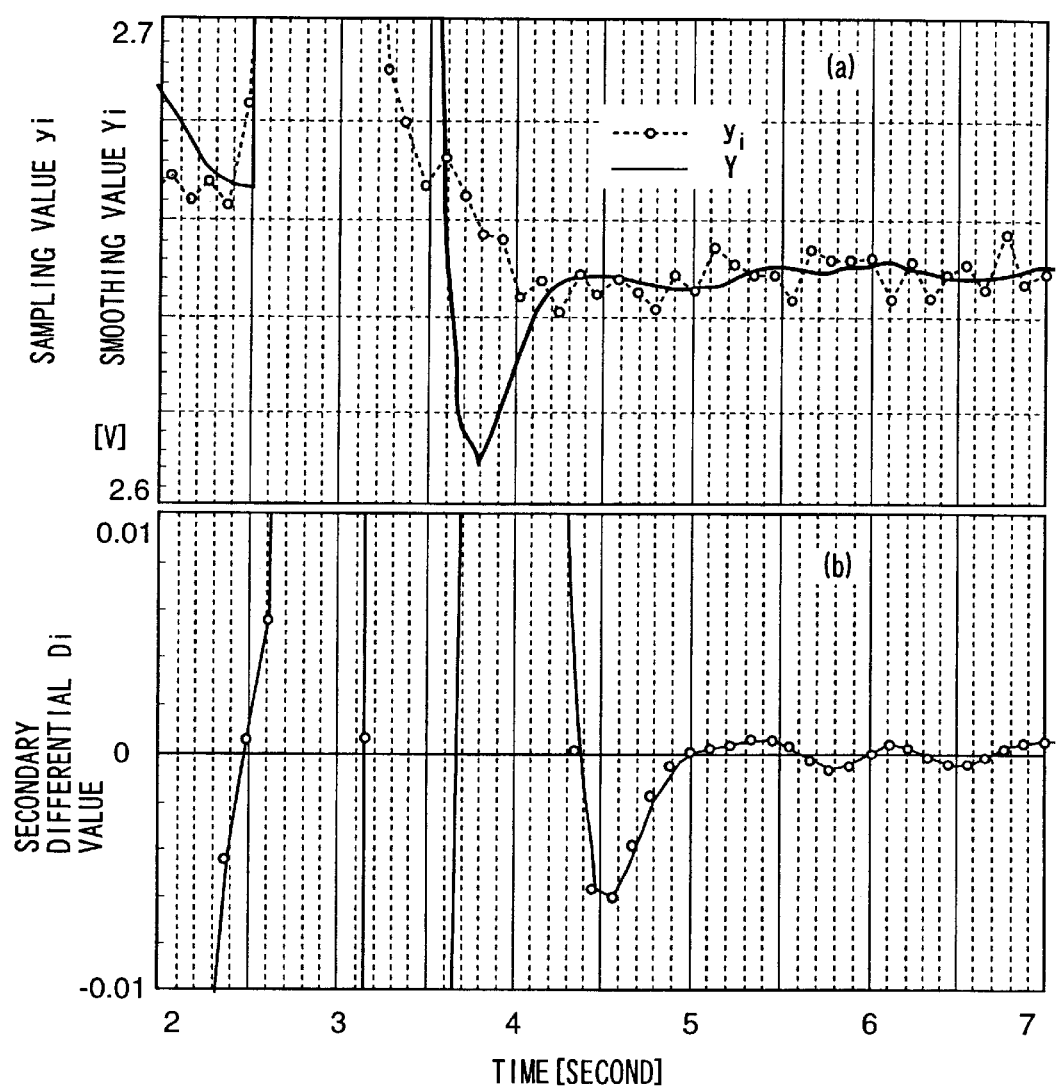
FIG. 12 is a graph which shows the original waveform and processed waveform when noise occurs according to the processing procedure shown in FIG. 9.

Other examples of this invention will be described below with reference to FIGS. 12 to 14. The same etching end point judging method as that applied in the previous example is used. These examples show processing performed when an abnormality occurs during etching and when pulse type noise is induced in the emission intensity sampling signal. FIG. 12 shows the secondary differential waveform that was calculated according to the processing procedure in the previous example when pulse type noise is induced during the time from the 2.5 second point to the 3.5 second point. As shown in the graph, a large undershoot appears in the smoothed time series data Yi, and, as a result, the smoothed secondary differential waveform may become inaccurate.

In this example, abnormality processing is performed by interrupting the calculation processing procedure for smoothed secondary differential coefficient time series data Di as shown in FIG. 13. When an abnormality occurs at i=m, smoothing processing is performed and the smoothed time series data is assigned as Ym−1=ym and Ym=ym. At the step i=m+1, Ym+1=ym+1 is assigned Ym+3 of the step i=m+2 is obtained by the secondary (second-order) Butterworth low pass filter ring processing of digital filter circuit 18 that was described above. At the step i=m+3, differential value time series data dm+1 is calculated by differential coefficient operation circuit 19 and the value is assigned in dm−1, dm, Dm−1, and Dm.

Data is smoothed by using these values, and smoothed differential coefficient time series data Dm+1 is obtained. In steps from i=m+4, smoothed differential coefficient time series data is calculated according to the processing procedure that is shown in FIG. 9. By this abnormality processing procedure, the smoothed differential coefficient time series data produced by eliminating the past time series data change can be obtained from the third step following the abnormality occurrence.

Figure 14:
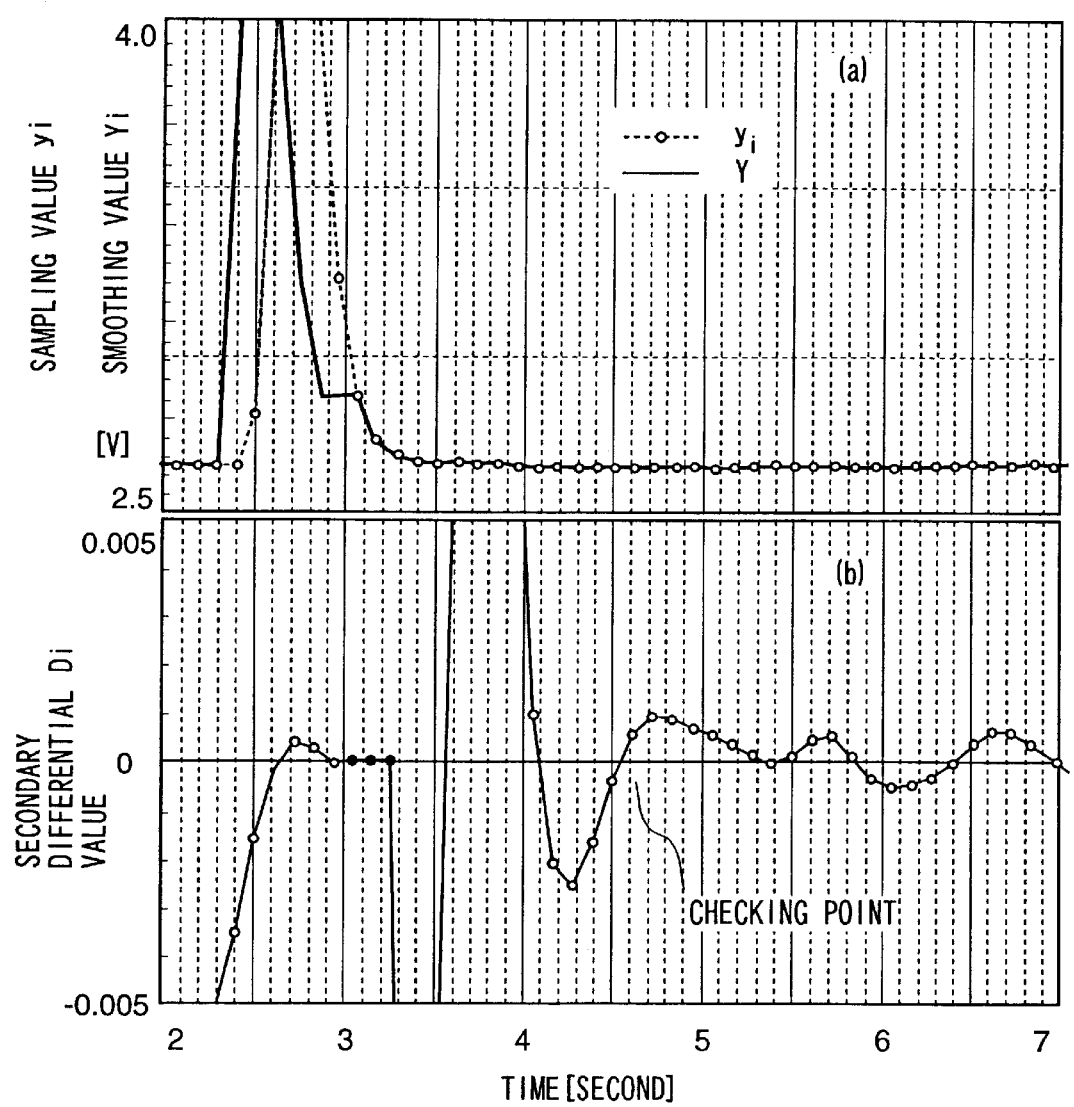
FIG. 14 is a waveform diagram which shows the original waveform and processing waveform of the implementation example shown in FIG. 13.

FIG. 14 shows smoothed time series data Yi and smoothed secondary differential value waveform Di when the abnormality processing is applied. On this graph, the time when the secondary differential passes the zero point is more accurately determined (4.5 seconds when there is no pulse type abnormality and 4.56 seconds in this processing) than the graph shown in FIG. 12. In this way, even if there are pulse type emission intensity fluctuations, the influence of the fluctuations can be reduced in a short time by performing abnormality processing. Consequently, accurate differential time series data used for judging an end point can be obtained, enabling stable end point judgment of etching processing.

This invention enables reduction of noise (shot noise of a light intercepting element, plasma light fluctuation, etc.) that is contained in a light signal by using digital filters and differential processing (S–G method).

According to the differential processing used by this invention, noise in an input signal waveform is initially reduced through the first digital filter. Then, a differential coefficient (primary or secondary) of the waveform is obtained using differential processing (S–G method). The noise components of the time series differential coefficient waveform that were obtained in the previous step are reduced by the second digital filter.

In this invention, abnormality processing is performed when the degree of change of the raw signal level exceeds the set value instantaneously (sampling interval).

That is, end point judging processing and display processing of a differential value smoothed signal are interrupted and an abnormality is displayed on a display window. If the degree of change of the raw signal level is a set value or less, the smoothed signal time series of the first step is reversed by two steps and the value of the current point is assigned. The differential value signal and the differential value smoothed signal are reversed by as many steps as the number of degrees of the S–G method and the value at the current point is assigned.

According to the abnormality processing of this invention, a noise reduction level and a time response characteristic can be set by controlling the filter characteristics of the digital filter.

Since primary or secondary differential coefficients are calculated using differential processing of the S–G method, differential values of mathematically high precision can be processed at a high speed. Noise components contained in differential values can also be removed. (Substantial effects at integer processing).

In addition, high-speed differential processing can be performed after an abnormality, and abnormality history data can be displayed easily. Post-abnormality high-speed differential processing can also be performed.

Abnormality processing according to this invention can also process abnormality flags from devices other than light signals. Unlike analog filter processing, digital filter processing can incorporate raw signals in an operation processing at any time. The processing brings about substantial effects in step etching.

Another example of this invention relates to the display method for displaying information at steps m and m−1 where an abnormality has occurred in the previous example. Normally, differential coefficient time series data is plotted on the monitor window of the display device that can monitor a state of etching processing any time during etching processing. Diagrams such as those diagrams (b) in FIGS. 11 and 14 are displayed on the monitor window.

For smoothed differential coefficient time series data items Dm−1 and Dm at the points of abnormality occurrence m and m−1, the corrected values are stored in RAM 9 and are used for obtaining the smoothed differential coefficient time series data of the next step. However, on the monitor window that displays a transition of the etching processing, the transition data is drawn on the zero or preset display position with a specific color arrangement. Since an etching abnormality is stored on the monitor window, etching abnormality history data is kept in the display device, enabling monitoring of abnormalities in real time.

Since the etching end point judging method of this example can be used to calculate emission intensity changes at high precision, the etching end point judging detection method can provide a very stable method for judging etching processing end points.

Figure 15:
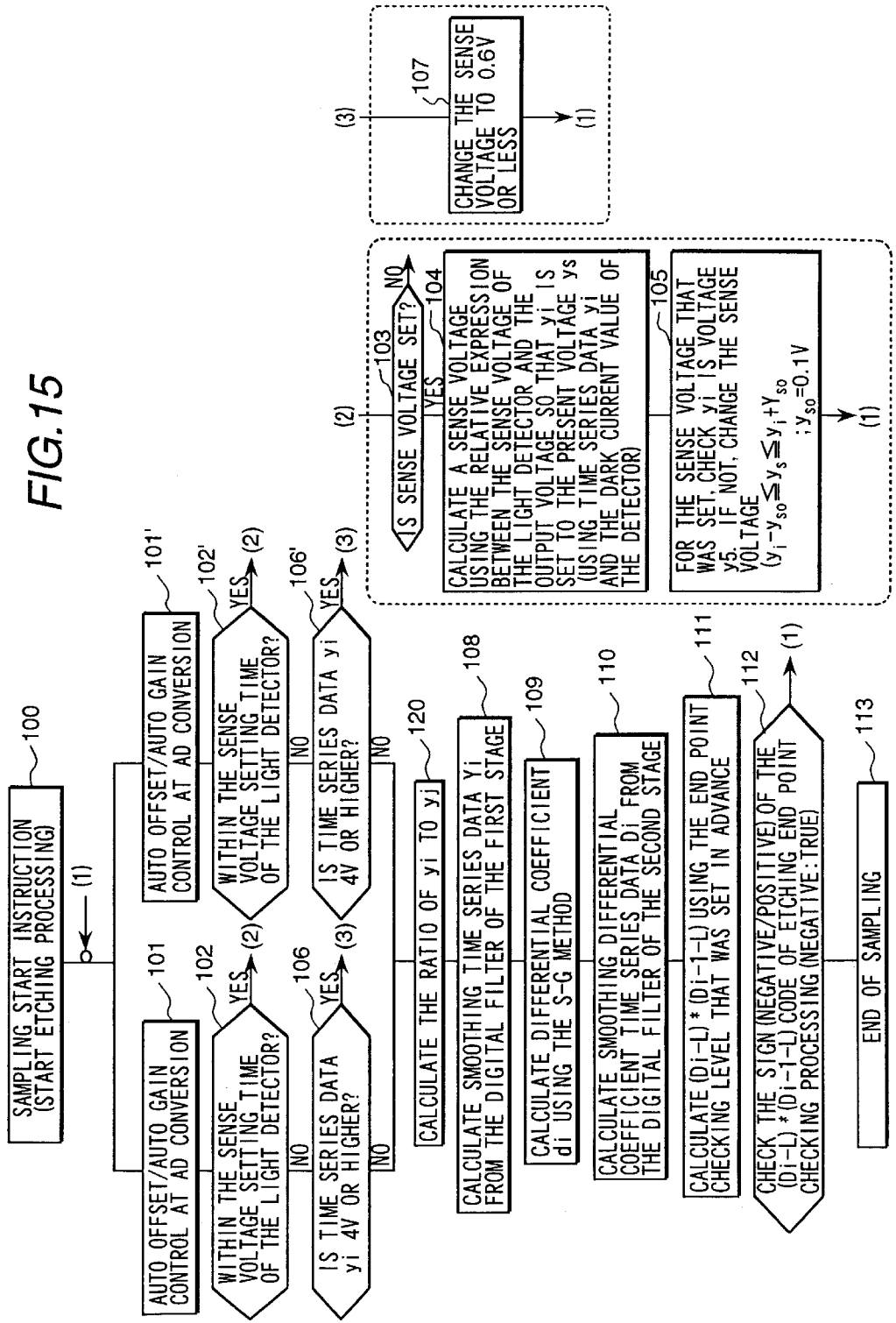
FIG. 15 is a flow diagram of a second example of the processing procedure used in the device shown in FIG. 1.

FIG. 15 is a flowchart of end point judging control, which is another example of this invention. This feature judges an end point by comparing two wavelengths.

When etching processing starts, the system issues a sampling start instruction (100). Emission of a specific wavelength that changes according to the progress of etching is detected as a light detection signal. An AD converter converts the signal to a digital value as sampling signal $I_i$ and stores it in RAM. During A/D conversion, auto offset/auto gain control is performed (101 and 101'). Then, the system checks to see whether the time is within the sense voltage setting time of light detector 11 (102 and 102'). If the time is within the voltage setting time, control is passed to sense voltage setting processing (103). When the time exceeds the sense voltage setting time, the system checks to see whether time series data items yi and yi' are 4 V or higher (106 and 106'). When the time series data items yi and yi' are 4 V or higher, the sense voltage is changed to 0.6 V or less (107). When the time series data items yi and yi' are less than 4 V, control is passed to smoothing processing.

In smoothing processing, initially, the ratio of time series data yi to yi' is calculated (120). The noise is reduced by the digital filter of the first stage and smoothed time series data yi is obtained (108). Differential coefficient (primary or secondary) di of a signal waveform is obtained by differential processing (S–G method)(109). Then, smoothed differential coefficient data Di is obtained by reducing the noise components of the time series differential coefficient waveform described above through the digital filter of the second stage (108). Using present end point judging level L, the result of $(D_i-L)*(D_{i-1}-L)$ is obtained.

By checking a negative or positive sign of the result of $(D_1-L)*(D_{i-1}-L)$, etching processing end point judging processing is performed (112). If the sign is negative, the system determines the result to be true and terminates the sampling (113). If the result is positive, the system returns control to the initial step (101).

Figure 2:
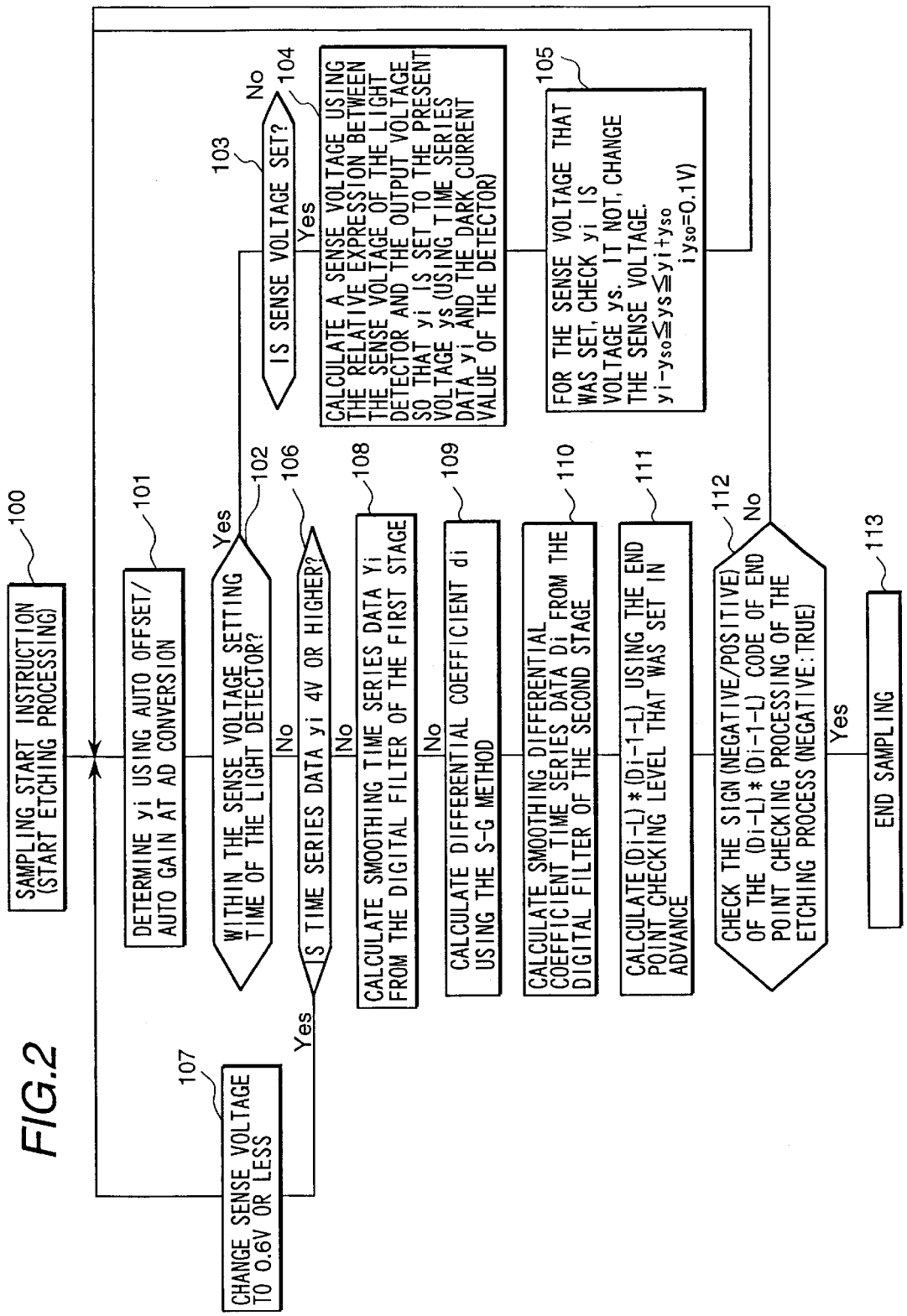
FIG. 2 is a flow diagram showing an example of the processing procedure employed in the device shown in FIG. 1.

An explanation of sense voltage setting processing (103) is omitted because this processing is the same as for FIG. 2.

By using the end point judging processing system of this invention that has been described, end points of an insulation film etching process of semiconductor devices can be measured with a high precision. Consequently, this method provides a method of implementing etching of a damascene process and a self-alignment process with a high precision. A semiconductor manufacturing process using such a system will be explained below.

FIGS. 16 to 19(e) relate to typical damascene processes. FIGS. 16 to 16(f) show a self-alignment dual damascene process; FIGS. 17(a) to 17(e) show a process that processes a groove first; FIGS. 18(a) to 18(e) show a process that processes a hole first; and FIGS. 19(a) to 19(f) show a process where a boundary layer of a hole and a groove is not formed. The process shown in FIGS. 19(a) to 19(f), is an ideal process involving the least number of steps. However, since a boundary surface between a hole and a groove is not formed, there are many etching characteristic requirements, such as uniformity of etching speed within the wafer surface and repeatability. There are many problems that are to be solved for employing this method for mass production.

Figure 16A:
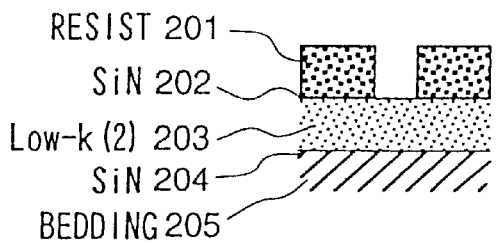
FIGS. 16(a) to 16(f) show an example of a self-alignment dual damascene process.
Figure 16B:
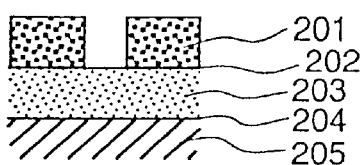

The damascene process will be explained using the example of self-alignment dual damascene processing shown in FIGS. 16 to 16(f). To process a hole, a hole is made on resist 201 by exposure development. Under the resist, silicon nitride film 202, low-k film 203, nitride silicon 204, and bedding 205, which is a wiring of the lower layer, are formed, as seen in FIG. 16. Initially, a mask corresponding to the shape of the hole is formed on resist 201, as seen in FIG. 16(a), and then the opening section corresponding to the hole of resist 202 is formed on silicon nitride film 202, which becomes a stopper layer. Resist 201 is removed and low-k film 206 and oxide film 207 are formed on silicon nitride film 202, as seen in FIG. 16(b). This low-k film 206 becomes an inter-wire insulation film of the upper section.

Figure 16C:
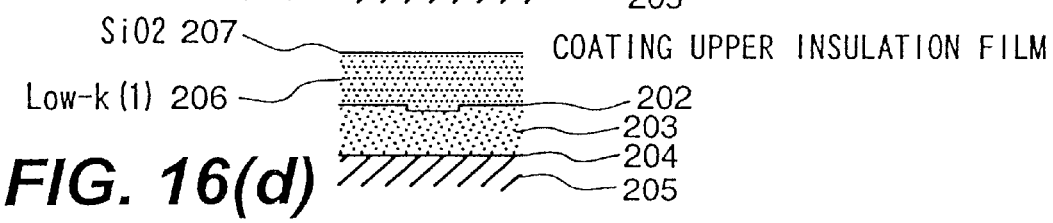
Figure 16D:
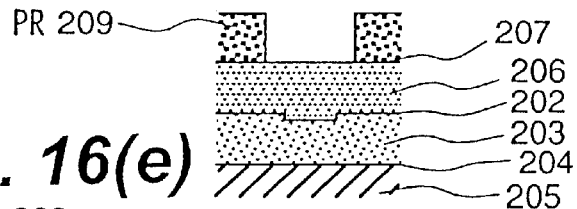
Figure 16E:
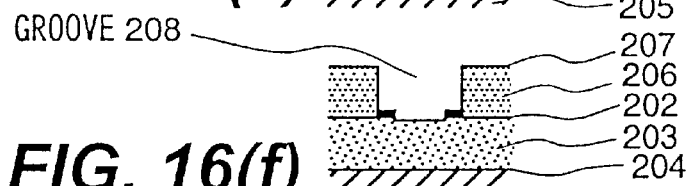
Figure 16F:
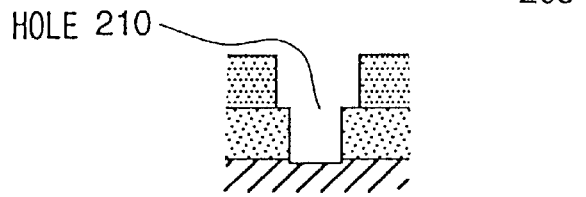

Then, as seen in FIG. 16(c), resist mask 209 for processing a groove is formed on oxide film 207 through exposure development, and then oxide film 207 and low-k film 206 are etched by plasma etching, as seen in FIG. 16(d). In this case, etching stops at silicon nitride layer 202, which is the stopper layer equivalent to the bedding of low-k film 206. When plasma etching is carried out using oxide film 207 as the mask of groove 208 and silicon nitride film 202 as the mask of the hole, hole 210 is formed, as seen in FIG. 16(f). Finally, silicon nitride film 204 is etched to effect contact with bedding 205. Then, wiring is formed by inserting a wiring material such as aluminum or copper in the opening section (hole 210) and smoothing the upper section.

The problem in plasma etching of self-alignment dual damascene is that the film thickness is reduced to several nm, since, if silicon nitride film 202 of the stopper layer is thick, the entire dielectric constant becomes high. Since the film is very thin, a high selection ratio to the low-k film must be set. If the etching speed uniformity or repeatability is low, over-etching must be applied excessively. This is also the reason for setting a high selection ratio.

In accordance with this invention, after the etching times of low-k films 206 and 203 are checked by the end point judging system and the specified over-etching is applied, etching processing is terminated. In this case, the end points must be judged in a short interval, preferably an interval of about 0.1 s because the silicon nitride films 202 and 204 of the stopper layer are very thin (several nm).

Since a correct time for etching on a low-k film so as to reach the silicon nitride film can be judged by using the end point judging method of this invention, unnecessary etching of silicon nitride 202 of the stopper layer can be prevented.

In accordance with this invention, the end point judging system judges the etching termination time, applies the specified over-etching, and ends the etching for silicon nitride film 204 that is formed on bedding 205. The method of this invention enables reduction of etching on bedding 205. However, to realize this, the end point judging system must support a function for judging an end point in a short time as described above, and, at the same time, the preparation time from the lighting of plasma and the start of etching to completion of preparation for end point judgment must be short. The duration is preferably 5 s or less. If an end point can be judged in such a short interval, the amount of over-etching by etching end point judgment can be set and corrosion of the bedding 205 can be controlled even if etching terminates in around 10 s.

FIGS. 17 and 18 show other examples relating to a damascene process. FIGS. 17a) to 17(e) show a process that processes a groove first, and FIGS. 18(a) to 18(e) show a process that processes a hole first. The difference between these two processes is only whether a hole is processed first or a groove is processed first, and the details of the application of this invention are the same as described above. In either case, oxide film 302, low-k film 303, silicon nitride film 304, low-k film 305, silicon nitride film 306, and begging 307, which becomes wiring of the lower layer are formed.

In FIG. 17(a), initially, resist mask 301 for processing a groove is formed by exposure development, and then groove 308 is formed by etching oxide film 302 and low-k film 303 by plasma etching, as seen in FIG. 17(b). At this time, etching stops at silicon nitride layer 304, which is a stopper layer equivalent to the bedding of low-k film 303. Then, hole 310 is formed through exposure development by applying resist mask 309, applying plasma etching, as seen in FIG. 17(c), and removing resist mask 309, as seen in FIG. 17(d). Finally, silicon nitride film 306 is etched to effect contact with bedding 307, as seen in FIG. 17(e). Then, wiring is formed by inserting a wiring material such as aluminum or copper in the opening section (310) and smoothing the upper section.

As shown in FIG. 18(a), resist mask 301 for processing a hole is formed by exposure development, and then hole 310 is formed by etching the oxide film and the low-k film using plasma etching, as seen in FIG. 18(b). In this case, etching stops at silicon nitride film 306 of the stopper layer that is equivalent to the bedding of low-k film 305. Exposure development is applied to resist mask 311 for processing a groove, as seen in FIG. 18(c), and groove 308 is formed by removing the resist mask through plasma etching, as seen in FIG. 18(d). Finally, silicon nitride film 306 is etched to effect contact with bedding 307, as seen in FIG. 18(e). Then, wiring is formed by inserting a wiring material such as aluminum or copper in the opening section and smoothing the upper section.

The damascene process as shown in FIGS. 17(a) to 17(e) and 18(a) to 18(e) enable startup of an end point judging system in a short time. Consequently, by implementing a specified over-etching by judging the etching end point up to the silicon nitride film using this system, excessive etching on a thin film such as a stopper layer can be controlled, resulting in high precision etching results.

FIGS. 19(a) to 19(f) show the dual damascene process when silicon nitride film 202, which is a stopper layer shown in FIG. 16, is not formed. The process involves etching of the following; resist 401, in which a mask for processing a hole is formed, as seen in FIG. 19(a), oxide film 402, low-k film 403, silicon nitride film 404, and the layer in which bedding 405 is formed. Initially, hole 406 that reaches silicon nitride film 404 is formed on low-k film using plasma etching, as seen in FIG. 19(b). Then, resist is applied and exposure development is applied to form resist 407 where a mask for processing a groove is formed, as seen in FIG. 19(c). Etching stops when a groove of the specified depth is formed on low-k film 403. Since low-k film 403 is uniform, it is not possible to judge, as an end point, the point where etching has reached the silicon nitride film. Therefore, by measuring the etching speed in advance and managing the etching time, etching is processed to the depth of the groove. In this case, strict etching speed uniformity within the wafer surface and repeatability are required.

Figure 20A:
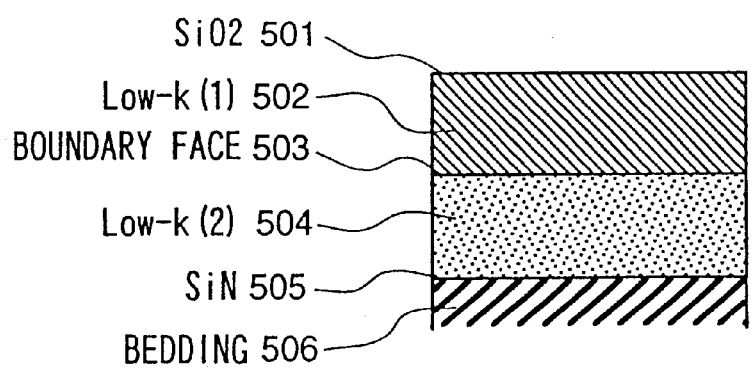
FIGS. 20(a) and 20(b) show an example of the process when a low-k film structure is introduced.
Figure 20B:
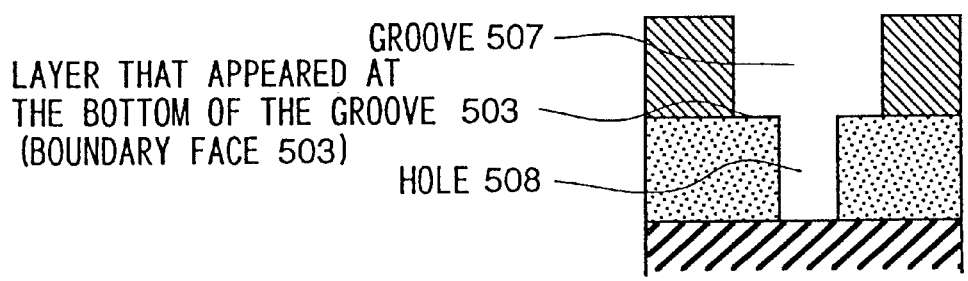

As the end point judging system of this invention, by using a high precision system that can start measurement preparation in a short time and can judge end points in a short interval and a system that can judge minimal changes (fluctuation of minimal etching characteristics) of plasma, the following method is enabled, resulting in more precise grooving processing. That is, the low-k film structure shown in FIG. 20(a) is introduced. The structure is formed by oxide film 501, low-k film 502, boundary face 503, low-k film 504, silicon nitride film 505, and bedding 506. In this case, low-k film 502 and low-k film 504 are low dielectric materials of different film types. It is important to form boundary face 503 between low-k film 502 and low-k film 504 by using films of slightly different specifications when the films are of the same type, by exposing low-k film 504 to the atmosphere by interrupting the film forming after the film is formed, or by applying a process whose surface state is different from the bulk. In this structure, although boundary face 503 is formed, a low dielectric constant can be maintained because all the film components are made of low dielectric materials.

As the next step, the film is etched by plasma etching. The description of the mask materials is omitted because they are the same as used for the process of FIGS. 19(a) to 19(f). After starting from the groove processing in FIG. 19, the etching characteristics of the bulk and boundary surface 503 become slightly different when the groove depth reaches boundary surface 503. The time required for etching to reach boundary face 503 can be judged using the end point judging system of this invention. Therefore, when etching ends at this point, a dual damascene structure that does not insert silicon nitride in the stopper layer with the groove depth of the boundary face 503 is completed. The performance required for the end point judgment is not only detection of minimal changes of plasma at high precision, since etching on boundary surface ends in a very short time, but also judgment of the amount of change by measuring the plasma emission in a short time interval. The end point judging system of this invention can satisfy these requirements. The numeral 508 denotes a hole for contact with bedding 506.

Figure 21:
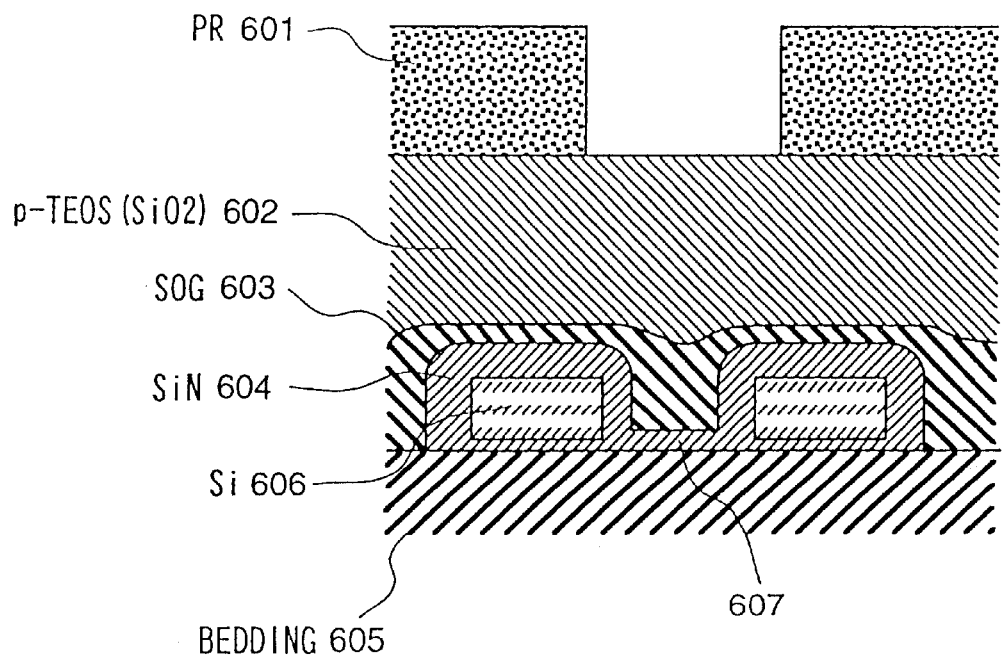
FIG. 21 shows, as an application example of this invention to self-alignment contact technology, a pre-etching cross-section of the self-alignment contact.
Figure 22:
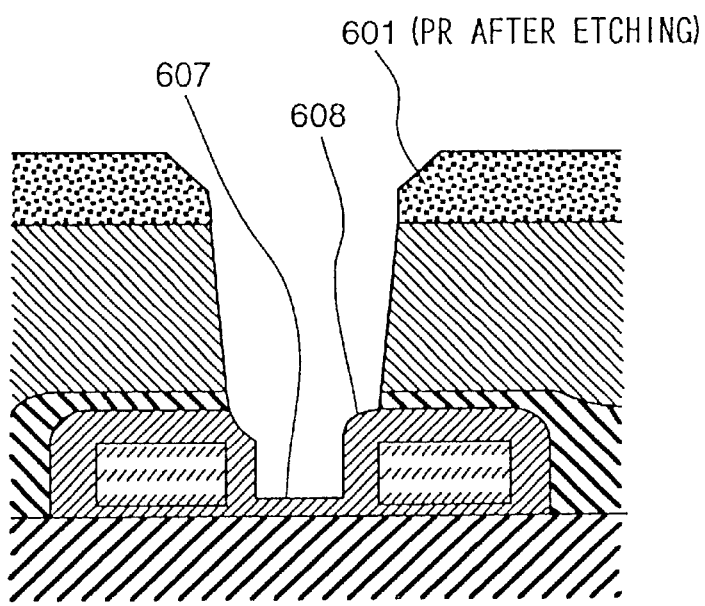
FIG. 22, as shows an application example of this invention to self-alignment contact technology, a post-etching cross-section of the self-alignment contact.

An example of applying this invention to self-alignment contact technology will be described below. FIG. 21 shows a pre-etching cross section of a self-alignment contact and FIG. 22 shows a post-etching cross section. The conventional contact holes are arranged at a slightly shorter distance than the distance between gates in order to resolve a drift at matching of the lithography position. As shown in FIGS. 21 and 22, since an insulation film is formed on the top and side of a gate in the self-alignment contact structure, the gate is protected by the insulation film even if the contact hole overlaps on the gate. Therefore, since a greater lithography position drift can be provided, a shorter distance between gate polarities becomes possible.

The structure of the self-alignment contact shown in FIG. 21 comprises resist 601, oxide film 602, such as TEOS or BPSG, oxide film 603, such as SOG, silicon nitride film 604, bedding 605, and gate 606. The area of gate 606 is the final contact area, and in the film structure of this example, the bottom of the hole 607 is formed in silicon nitride film 604. Therefore, a process for removing silicon nitride film 607 is required after etching of the oxide film 602 is completed. For plasma etching of a self-alignment contact film, since the process using a CF gas has been developed and many research examples are reported regarding the etching characteristics, a description of the etching is omitted in this document.

As shown in FIG. 22, the problems of etching are noticeable corrosion on the bottom of the hole in the resist (corresponds to 607) and corrosion of the shoulder section 608 of the silicon nitride film 604. In particular, when an oxide film is etched repeatedly, the temperature on the wall in the etching chamber fluctuates, the deposition characteristics of the etching gas and etching residue on the inside wall fluctuate, or the gas discharge behavior changes. As a result, etching characteristics are changed and sometimes etching down to the bedding is disabled. This phenomenon is called etch stop. When etch stop occurs, a large number of device faults occur. Therefore, etch stop must be definitely prevented. Detection of etch stop is also important.

When the end point judging system of this invention is used, high time precision for detecting minimal etching characteristic fluctuations can be achieved since the system can measure in a short time changes of plasma emission, that is, the plasma change measuring time interval is short. The time required for etching from the start of etching in the state shown in FIG. 21 to reaching the upper face of oxide film 603 (boundary face between oxide film 602 and oxide film 603), is determined through progress of etching on oxide film 602. The etching speed is obtained using this data and the thickness of the oxide film 602 that has been measured, and the result is recorded and stored as etching speed data for oxide film 602. By comparing the etching speed data for the previous etching and this data, changes in the passage of time of the etching device can be obtained. The yield can be improved by displaying the data on the control panel of the etching device and checking the stability of the device during production.

The method of this invention can also be applied for monitoring stable operation of the device since the method enables measurement of speed easily during etching processing. The next step is to etch a narrow area between gates by etching oxide film 603. The etching speed obtained by the method described above can also be used as the base data for improving the selection ratio by retarding etching of the shoulder section 608 or determining the over-etching time after etching reaches the bottom of the hole 607 of silicon nitride film 604. In addition, by obtaining the etching speed of oxide film 603 between gates in the same method, the data can be used for verifying the stability of etching characteristics or detection of etch stop. Even if the film thickness is not available in advance, the stability of etching characteristics in the lot can be verified by checking the degree of changes of etching time for each wafer. As described above, the data can also be constantly monitored by displaying it on the controller of the device and can be used for determining timing of changing the process condition or timing of full sweep.

Another example of this invention shows utilization of features of the quick measurement preparation and the short end point judgment interval. An end point is judged with a high precision in a short time by using the end point judging system of this invention in the case where a contact between the lower section (bedding 605) and the upper section is formed by removing silicon nitride 604 by etching so as to complete etching of self-alignment contact, as shown in FIG. 22. Since the bottom 607 of the silicon nitride film 604 is very thin, bedding 605 may be excessively etched unless a correct etching end point is judged. Since the etching time is short (10 and several seconds), the set plasma measurement preparation time must be shorter than usual. By using the end point judging system of this invention, the end point can be judged easily.

In the example shown in FIG. 1, emission of a specific wavelength from the plasma generated within chamber 2 is obtained by spectroscope 12; however, the same result can be achieved by passing a light of the area of the specific wavelength and using an optics filter that shuts out the light of other wavelength areas or dramatically attenuates the light, instead of using spectroscope 12.

In the example shown FIG. 1, a spectroscope and a photo-multiplier are used. However, as described in Japanese Non-examined Patent Publication 59-18424, by digitizing the signals corresponding to multi-wavelengths through an AD modulator, using a slit, grading, and line sensor, the data can be stored in a storage unit in a specified cycle, or data corresponding to the required wavelength can be fetched in a specified cycle. This system has an advantage of being able to set a required wavelength electronically.

When a slit, grading, or a line sensor is used and a long interval is set for a scan start signal of the line sensor, the accumulated electric charge is increased, increasing the size of the output signal. To prevent this phenomenon, automatic gain adjustment is enabled by monitoring the size of the signal output from the line sensor and adjusting the interval of the scan start signal of the line sensor so that the maximum value is set to a specified value.

When the number of elements of the line sensor is insufficient for the required wavelength precision, the wavelength precision can be improved by internal insertion.

Characteristic irregularity in this system results in irregularity of wavelengths of the light that forms spectra to the linear sensor side. Therefore, wavelengths corresponding to the data stored in the storage unit that was described above can be calibrated by allowing input of light from a standard light source for calibration that has known optical spectrum in addition to the light from the chamber as the light to be input to a slit (for instance, using dual fibers) and setting the standard light source for calibration to ON periodically.

This example shows judgment of an etching end point using plasma, however, the method is also effective for judging a cleaning end point using plasma so that the method can be used for judging end points of plasma cleaning after etching processing or after plasma CVD. That is,,the method can be applied for judging end points of plasma processing and has the following features.

(1) Plasma processing end point judging device with the following features in plasma processing end point judgment using emission spectrometry: an AD conversion method for obtaining emission intensity time series data of a specific wavelength, a first digital filtering method for smoothing processing of the time series data, a differential operation method for obtaining a differential coefficient of the smoothed time series data, a second digital filtering method for smoothing processing of time series data of the calculated differential coefficient, and a discrimination method for judging an end point of plasma processing by comparing the smoothed differential coefficient value and the preset value.

(2) Plasma processing end point judging device with the following features in the plasma processing end point judging device described above: a method for detecting a plasma processing abnormality, a first digital filtering correction method that corrects the smoothed time series data at detection of an abnormality and the time series data of the differential coefficient, and the smoothed differential coefficient time series data, differential operation correction method, and a second digital filtering correction method.

(3) Plasma processing end point judging device with the following features in the method of judging plasma processing end points from time series data of emission intensity differential coefficient: a method for displaying a transition of times series data of the differential coefficient described above and a method for displaying an abnormality on the time series data display of the differential coefficient described above at detection of an abnormality.

The etching method of this invention can calculate emission intensity changes with a high precision. Consequently, an etching end point detection method that uses this feature can provide a very stable etching processing end point judgement.

This invention enables determination of a correct sense voltage value for a target output voltage of a photo-multiplier by obtaining and using a sense voltage value for a target output voltage of a photo-multiplier through a relational expression. Therefore, even for a semiconductor wafer having a small opening ratio, this invention can provide a method of controlling the signals used for repeatedly detecting etching end points within a constant value without irregularity between wafers for stable detection of etching end points of semiconductor wafers.

By using this invention, the noise of sampling signals from a light detector can be reduced effectively, enabling stable end point judgment by setting digital filtering processing before and after differential coefficient calculation processing in end point judgment for differential coefficient calculation processing for judging end points. By providing coefficient correction processing in the digital filtering processing of the prior stage, differential coefficient calculation processing, and digital filtering processing of the post stage, noise of sampling signals from a light detector can be reduced more effectively, enabling stable and high-precision end point judgment. In addition, in a differential coefficient display, by drawing on the zero or a preset display position using a specific color arrangement at the time of an etching processing abnormality, an effective device for facilitating abnormality monitoring during etching can be provided.

This invention enables accurate execution of end point judgment so that low over etching can be set in comparison to the etching managed by time. As a result, excessive corrosion of the bedding layer can be controlled. In addition, an over etching time can be reduced, resulting in improvement of the throughput. Since changes can be monitored in the passage of time, an etching device abnormality can be detected at an early stage, preventing a large number of etching faults.

What is claimed is:

1. An etching end point judging method for dry etching, comprising first a step of reducing the noise in an input signal waveform by means of a first digital filter, a second step of simultaneously obtaining a primary differential coefficient and a secondary differential coefficient of the input signal waveform by means of differential processing using digital filters, a third step of obtaining a smoothened differential coefficient by using a second digital filter to reduce the noise component in the time series of differential coefficients obtained during said second step, and a fourth step of judging the etching end point by comparing said smoothened differential coefficient with a value set beforehand by means of a discrimination means, wherein said digital filters comprise filters having cascade connections of second-order low-pass Butterworth type filters.

2. An etching end point judging method using emission spectroscopy for dry etching, wherein said method comprises a step of obtaining time series data of the emission intensity of a specific wavelength produced during etching using an A/D conversion means, a step of obtaining smoothened time series data by performing smoothening of said time series data using a first digital filtering means, a step of simultaneously obtaining time series data of a primary differential coefficient and a secondary differential coefficient by carrying out differential processing of said smoothened time series data using digital filters and a differentiation operation means, a step of obtaining a smoothened differential coefficient by performing smoothening of said time series data of said differential coefficients using a second digital filtering means, and a step of judging the etching end point by comparing said smoothened differential coefficient with a value set beforehand by means of a discrimination means, wherein said digital filters comprise filters having cascade connections of second-order low-pass Butterworth type filters.

3. An etching end point judging method according to claim 1 or claim 2 wherein said method further comprises a step of obtaining a rough absolute value of a signal voltage by carrying out A/D conversion of an input signal waveform by a low gain operation, a step of obtaining an input voltage of a differential amplifier circuit of the A/D converter on the basis of the resolution of the D/A converter, a step of outputting from the D/A converter an input voltage $V_0$ of the A/D converter obtained in the above step, a step of performing A/D conversion of the difference waveform of the input signal waveform through a high gain operation and obtaining a difference signal voltage $V_1$ with a high accuracy, and a step of combining the voltage values that were obtained by the above two steps.

4. An etching end point judging method according to claim 3 in which an offset value input to the differential circuit is obtained by truncating one bit from the resolution of the D/A converter.

5. An etching end point judging method according to claim 1 or claim 2 wherein said method further comprises a step of detecting abnormalities in the etching process and a step of correcting respectively said smoothened time series data, said time series data of the differential coefficient, and said smoothened differential coefficient time series data at the time an abnormality is detected.

6. An etching end point judging method according to claim 5 wherein said method further comprises, when the amount of variation of the raw signal level exceeds the set value, a step of interrupting the end point judgment operation of the differential value smoothened signal and the display operation of the differential value smoothened signal, a step of displaying the abnormality on a display screen, and, if the variation of the raw signal level is equal to or less than a set value, a step of replacing the first smoothened signal time series with a value two steps earlier than the present step and replacing the differential value signal and the differential value smoothened signal with values several steps earlier after a differentiation operation.

7. An etching point judging method according to claim 2, wherein the differential processing is an S–G differential processing method.

8. An etching point judging method according to claim 1, wherein the differential processing is an S–G differential processing method.

9. An etching end point judging method based on time series data of a primary differential coefficient and a secondary differential coefficient of light emission intensity by means of differential processing using digital filters, wherein said method comprises a step of displaying on a displaying means a transition of said time series data of said differential coefficient and a step of adding an indication of an abnormality to said display of said time series data of the differential coefficient in the event any abnormality is detected, wherein said digital filters comprise filters having cascade connections of second-order low-pass Butterworth type filters.

10. In the etching of insulation films, including a silicon oxide film and a low-k film consisting of a material of a low dielectric constant, an insulation film etching method which includes judging an etching end point from the etching end point judging method described in claim 1 or claim 9.

11. In the etching by an insulation film damascene process of semiconductor devices, an insulation film etching method which includes judging an etching end point by the etching end point judging method described in claim 1 or claim 9.

12. In the etching method described in claim 11, an insulation film etching method which includes obtaining an etching speed by measuring the time it takes for etching to reach the stopper layer of the damascene processing.

13. In the etching by a self-alignment process of insulation films of a semiconductor device, an insulation film etching method which includes judging an etching end point by the etching end point judging method described in claim 1 or claim 9.

14. In the etching method described in claim 13, an insulation film etching method which includes obtaining an etching speed by measuring the etching time it takes for etching to reach the insulation film on the gate of the self-alignment contact process.

15. An etching point judging method according to claim 9, wherein the differential processing is an S–G differential processing method.

* * * * *